US009964973B2

(12) United States Patent
Smith et al.

(10) Patent No.: US 9,964,973 B2
(45) Date of Patent: May 8, 2018

(54) POWER QUALITY DIFFERENTIATION IN HAZARD DETECTION SYSTEMS

(71) Applicant: Google Inc., Mountain View, CA (US)

(72) Inventors: Ian C. Smith, Palo Alto, CA (US); Daniel Adam Warren, San Francisco, CA (US); Scott Mullins, Gilroy, CA (US); Brian Jonathan Conner, San Jose, CA (US)

(73) Assignee: GOOGLE LLC, Mountain View, CA (US)

( * ) Notice: Subject to any disclaimer, the term of this patent is extended or adjusted under 35 U.S.C. 154(b) by 924 days.

(21) Appl. No.: 14/333,917

(22) Filed: Jul. 17, 2014

(65) Prior Publication Data
US 2015/0022026 A1    Jan. 22, 2015

Related U.S. Application Data

(60) Provisional application No. 61/847,905, filed on Jul. 18, 2013, provisional application No. 61/847,916, filed on Jul. 18, 2013.

(51) Int. Cl.
| | |
|---|---|
| G05F 1/46 | (2006.01) |
| G08B 17/10 | (2006.01) |
| H02J 1/06 | (2006.01) |
| G06F 1/32 | (2006.01) |
| G08B 21/18 | (2006.01) |
| G08B 25/10 | (2006.01) |

(Continued)

(52) U.S. Cl.
CPC .............. *G05F 1/46* (2013.01); *G06F 1/3203* (2013.01); *G08B 17/10* (2013.01); *G08B 17/117* (2013.01); *G08B 21/18* (2013.01); *G08B 25/08* (2013.01); *G08B 25/10* (2013.01); *H02J 1/06* (2013.01); *G06F 1/3287* (2013.01); *H02M 2001/008* (2013.01); *H03K 2217/0036* (2013.01); *Y02B 60/1282* (2013.01); *Y02P 80/11* (2015.11); *Y10T 307/367* (2015.04); *Y10T 307/461* (2015.04)

(58) Field of Classification Search
CPC ....................................................... G08B 17/00
See application file for complete search history.

(56) References Cited

U.S. PATENT DOCUMENTS

| | | |
|---|---|---|
| 5,959,529 A | 9/1999 | Kail |
| 6,624,750 B1 | 9/2003 | Marman et al. |

(Continued)

FOREIGN PATENT DOCUMENTS

| | | |
|---|---|---|
| AU | 2009100570 | 7/2009 |
| CN | 1835017 | 9/2006 |

(Continued)

*Primary Examiner* — Daniel Cavallari
(74) *Attorney, Agent, or Firm* — Van Court & Aldridge LLP

(57) ABSTRACT

Hazard detection systems according to embodiments described herein are operative to provide failsafe safety detection features and user interface features using circuit topology and power budgeting methods that minimize power consumption. The safety detection features can monitor environmental conditions (e.g., smoke, heat, humidity, carbon monoxide, carbon dioxide, radon, and other noxious gasses) in the vicinity of the hazard detection system associated and alarm occupants when an environmental condition exceeds a predetermined threshold.

16 Claims, 14 Drawing Sheets

(51) Int. Cl.
*G08B 17/117* (2006.01)
*G08B 25/08* (2006.01)
*H02M 1/00* (2006.01)

(56) References Cited

U.S. PATENT DOCUMENTS

| | | | |
|---|---|---|---|
| 7,690,569 B2 | 4/2010 | Swanson et al. | |
| 8,847,772 B2 | 9/2014 | Marks et al. | |
| 9,178,356 B2 | 11/2015 | Bryson | |
| 2002/0044061 A1* | 4/2002 | Johnston | G01N 33/004 340/628 |
| 2006/0114113 A1 | 6/2006 | Yokosawa et al. | |
| 2007/0139183 A1 | 6/2007 | Kates | |
| 2009/0029716 A1 | 1/2009 | Thomas | |
| 2013/0326244 A1* | 12/2013 | Koyama | G06F 1/26 713/300 |
| 2014/0085092 A1 | 3/2014 | Fadell et al. | |
| 2015/0022316 A1 | 1/2015 | Dixon et al. | |

FOREIGN PATENT DOCUMENTS

| | | |
|---|---|---|
| CN | 1851767 A | 10/2006 |
| CN | 102281370 | 12/2011 |
| CN | 102496248 | 6/2012 |
| DE | 10032055 A1 | 2/2002 |
| JP | H06-004784 | 1/1994 |
| JP | H09-120488 A | 5/1997 |
| JP | 2005-228078 A | 8/2005 |
| JP | 2007-521712 A | 8/2007 |
| JP | 2010-198250 A | 9/2010 |
| WO | 1994/03881 | 2/1994 |
| WO | 9839749 | 9/1998 |
| WO | 00/21053 | 4/2000 |

* cited by examiner

| MODE | PGC 353 | PGC 354 | PGC 355 | PGC 361 | PGC 362 | PGC 363 | PGC 364 | PGC 365 | PCC 344 | PCC 346 |
|---|---|---|---|---|---|---|---|---|---|---|
| IDLE | OFF | CYCLED ON/OFF | CYCLED ON/OFF | ON | CYCLED ON/OFF | OFF | OFF | OFF | OFF | OFF |
| LOG UPDATE | OFF | CYCLED ON/OFF | CYCLED ON/OFF | ON | CYCLED ON/OFF | ON | OFF | OFF | ON | OFF |
| SOFTWARE UPDATE | OFF | CYCLED ON/OFF | CYCLED ON/OFF | ON | CYCLED ON/OFF | ON | OFF | OFF | ON | OFF |
| ALARM | ON | ON | ON | ON | ON | ON | ON | ON | ON | ON |

FIG. 4

| MODE | RELATIVE POWER CONSUMPTION PROFILE | MODE SPECIFIED RUN-TIME CONSTRAINT (E.G., SECONDS PER YEAR) | DUTY CYCLE DURING OPERATIONAL LIFETIME (E.G., 10 YEARS) |
|---|---|---|---|
| IDLE | LOW | UNCONSTRAINED (E.G. 31,536,000) | >99.9% |
| LOG UPDATE | MEDIUM | MODERATELY CONSTRAINED (E.G., 14,600) | <0.05% |
| SOFTWARE UPDATE | MEDIUM/HIGH | SEVERLY CONSTRAINED (E.G., 180) | <0.0006% |
| ALARM | HIGH | SEVERLY CONSTRAINED (E.G., 300) | <0.00095% |

FIG. 5

Mode Summary

| Feature | IDLE | Log Update | SW Update | Alarms |
|---|---|---|---|---|
| 6LoWPAN | Listen Mode | Listen Mode | Listen Mode | Tx Mode |
| System Processor | Data Collection | Log Update | SW Update | Alarm Active |
| Non-volatile Memory | Sleep | Sleep | SW Update | Alarm Active |
| Safety Processor | Sensor Check | Sensor Check | SW Update | Alarm Active |
| WiFi | Sleep | Log Update | SW Update | Alarm Active |
| ALS | Sensor Check | Sensor Check | Sensor Check | Sensor Check |
| Smoke | Sensor Check | Sensor Check | Sensor Check | Alarm Active |
| CO | Sensor Check | Sensor Check | Sensor Check | Alarm Active |
| Temperature | Sensor Check | Sensor Check | Sensor Check | Alarm Active |
| Ultrasonic | Sleep | Sleep | Sleep | Alarm Active |
| PIR | Sensor Check | Sensor Check | Sensor Check | Alarm Active |
| Speaker | Sleep | Sleep | Sleep | Alarm Active |
| Display Module | Alive Indicator | Alive Indicator | Alive Indicator | Alarm Active |
| Alarm | Sleep | Sleep | Sleep | Alarm Active |
| Total | - | - | - | - |
| Duty Cycle | Constant 100% | Initial $D_{LU_O}$ → Variable $D_{LU_V}$ | Initial $D_{SW_O}$ → Variable $D_{SW_V}$ | $D_A$ |

FIG. 6

POWER QUALITY DIFFERENTIATION IN HAZARD DETECTION SYSTEMS

CROSS-REFERENCE TO RELATED APPLICATIONS

This patent application claims priority to each of U.S. Provisional Patent Application Nos. 61/847,905, filed Jul. 18, 2013, and 61/847,916, filed Jul. 18, 2013. Each of the above-referenced patent applications is incorporated by reference in its entirety for all purposes.

TECHNICAL FIELD

This patent specification relates to systems and methods for managing power consumption in a hazard detection system. More particularly, this patent specification relates to circuitry and methods for maximizing power efficiency for battery powered hazard detection systems.

BACKGROUND

Hazard detection systems such as smoke detectors, carbon monoxide detectors, combination smoke and carbon monoxide detectors, as well as systems for detecting other dangerous conditions have been used in residential, commercial, and industrial settings for safety considerations. These systems can be powered by line power, battery power, a combination of both line and battery power, or a control panel. As these systems advance to perform features in addition to sensing for hazards, additional demands for power are needed, especially for systems that are powered solely by a battery source. Accordingly, circuits and techniques for efficiently managing power consumption in hazard detection systems are needed.

SUMMARY

Hazard detection systems according to embodiments described herein are operative to provide failsafe safety detection features and user interface features using circuit topology and power budgeting methods that minimize power consumption. The safety detection features can monitor environmental conditions (e.g., smoke, heat, humidity, carbon monoxide, carbon dioxide, radon, and other noxious gasses) in the vicinity of the hazard detection system associated and alarm occupants when an environmental condition exceeds a predetermined threshold. The user interface features can include relatively power hungry features that enhance a user's interaction with the hazard detection system. For example, user interface features can include vocal alarms, voice setup instructions, cloud communications (e.g. push monitored data to the cloud, or push notifications to a mobile phone, receive commands from the cloud such as a hush command), device-to-device communications (e.g., communicate with other hazard detection systems), visual safety indicators (e.g., display of a green light indicates it is a safe and display of a red light indicates danger), tactile and non-tactile input command processing, and software updates. Many of these features can be relatively demanding of power resources (e.g., especially wireless data communication features), however, circuit arrangements and power budgeting schemes according to various embodiments enable the hazard detection system to reliably function for years on a battery power source.

In one embodiment, the hazard detection system can selectively power gate one or more components to conserve power. Power gating a component OFF can substantially eliminate quiescent current losses for the component that is power gated OFF. The load switch, which effectively removes a power source from the component, can have a quiescent current, but it is much less than the component being power gated. In this embodiment, a hazard detection system can include a DC power source, a power bus coupled to the DC power source, and a first group of components that are operable to be power gated ON and OFF, wherein the first group of components includes a first hazard sensor. The system can also include power gating circuitry that selectively couples and de-couples the first group of components to the power bus. The system further includes a second group of components that are not operable to be power gated ON and OFF. The second group of components can be coupled to the power bus and can include a second hazard sensor. In addition, the system can include control circuitry operative to control the power gating circuitry by instructing the power gating circuitry to selectively couple and de-couple at least one component of the first group of components to the power bus.

In another embodiment, a hazard detection system can use a bifurcated processor circuit arrangement. In this embodiment, the hazard detection system can include several safety sensors such as a smoke sensor, a carbon monoxide sensor, and a heat sensor. It can include a safety processor that is operative to communicate with the safety sensors and activate an alarm if any of the safety sensors detect a hazard event. The system can also include a system processor that is operative to execute a plurality of user interface features. The safety processor can be characterized by relatively low power consumption and relatively limited processing power in comparison to that of the system processor, and the safety processor is operative to independently activate the alarm regardless of whether the system processor is functioning.

In yet another embodiment, a DC power budgeting scheme can be used by the hazard detection system. In this embodiment, a battery powered hazard detection system can include a DC power source and several power-consuming components operative to consume power supplied by the DC power source, the power-consuming components including at least one processor, at least one sensor for detecting at least one of smoke, heat, and carbon-monoxide. The system can include first wireless communications circuitry characterized by relatively low power consumption and configured to wirelessly communicate according to a first protocol characterized by relatively low data rates, and second wireless communications circuitry characterized by relatively high power consumption and configured to wirelessly communicate according to a second protocol characterized by relatively high data rates. At least one of the power consuming components is operative to enforce a power budgeting scheme so that the DC power source can power the system for a minimum operational lifetime. The power budgeting scheme can enable the system to operate according to any one of a plurality of different modes for a mode-specified run-time constraint during the minimum operational lifetime.

In yet another embodiment, a power management scheme can limit peak power events to maximize energy usage of a DC power source. In this embodiment, a battery powered hazard detection system can include a battery power source and several power-consuming components operative to consume power supplied by the battery power source, the power-consuming components including at least one processor, at least one hazard sensor, a speaker, an alarm, low-power wireless communications circuitry, and high-power wireless communications circuitry. The at least one processor is operative to enforce a peak power limiting scheme, and is further operative to receive an instruction to execute a power consuming event. The at least one processor can determine if the power consuming event is can be independently executed by each one of at least two power consuming components of the plurality of power consuming components, and when the power consuming event has been determined to be independently executed by each one of the at least two power consuming components, execution of the power consuming event is limited to one of the at least two power consuming components.

The hazard detection system can use a circuitry arrangement that provides power of different qualities to different components. In this embodiment, a smoke, heat, and carbon monoxide detection system can include a DC power node, a power converter coupled to the DC power node and operative to provide a first signal at a first voltage level to a power bus, and at least one component coupled to the power bus and operative to consume power using the first signal at the first voltage level. The system can also include a low dropout regulator coupled to the power bus. The regulator can convert the first signal to a second signal at a second voltage level. The system also can include a plurality of safety sensors coupled to the low dropout regulator and operative to consume power at the second voltage level, and the first voltage level is different than the second voltage level.

A further understanding of the nature and advantages of the embodiments discussed herein may be realized by reference to the remaining portions of the specification and the drawings.

BRIEF DESCRIPTION OF THE DRAWINGS

FIG. 4 shows an illustrative state diagram indicating the ON/OFF states of power gating circuitry and power converting circuitry for several different modes of operation of a hazard detection system, according to some embodiments;

FIG. 5 shows an illustrative chart of various aspects of a power budgeting scheme, according to some embodiments;

FIG. 6 shows an illustrative chart of various components in a hazard detection system, according to some embodiments;

DETAILED DESCRIPTION OF THE DISCLOSURE

In the following detailed description, for purposes of explanation, numerous specific details are set forth to provide a thorough understanding of the various embodiments. Those of ordinary skill in the art will realize that these various embodiments are illustrative only and are not intended to be limiting in any way. Other embodiments will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual embodiment, numerous embodiment-specific decisions may be required to achieve specific design objectives. These design objectives will vary from one embodiment to another and from one developer to another. Moreover, it will be appreciated that such a development effort might be complex and time-consuming but would nevertheless be a routine engineering undertaking for those of ordinary skill in the art having the benefit of this disclosure.

It is to be appreciated that while one or more hazard detection embodiments are described further herein in the context of being used in a residential home, such as a single-family residential home, the scope of the present teachings is not so limited. More generally, hazard detection systems are applicable to a wide variety of enclosures such as, for example, duplexes, townhomes, multi-unit apartment buildings, hotels, retail stores, office buildings, and industrial buildings. Further, it is understood that while the terms user, customer, installer, homeowner, occupant, guest, tenant, landlord, repair person, and the like may be used to refer to the person or persons who are interacting with the hazard detector in the context of one or more scenarios described herein, these references are by no means to be considered as limiting the scope of the present teachings with respect to the person or persons who are performing such actions.

Figure 1:
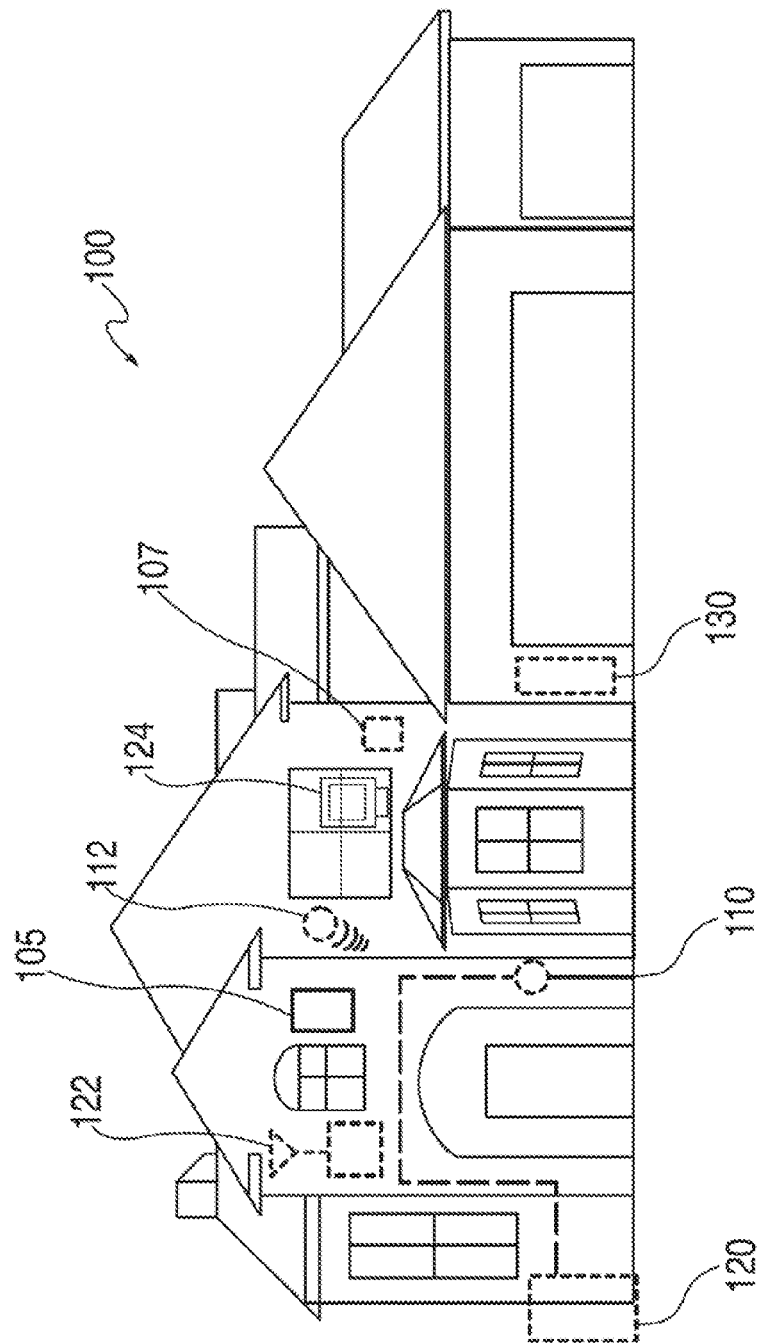
FIG. 1 is a diagram of an enclosure with a hazard detection system, according to some embodiments.

FIG. 1 is a diagram illustrating an exemplary enclosure 100 using hazard detection system 105, remote hazard detection system 107, thermostat 110, remote thermostat 112, heating, cooling, and ventilation (HVAC) system 120, router 122, computer 124, and central panel 130 in accordance with some embodiments. Enclosure 100 can be, for example, a single-family dwelling, a duplex, an apartment within an apartment building, a warehouse, or a commercial structure such as an office or retail store. Hazard detection system 105 can be battery powered, line powered, or be line powered with a battery backup. Hazard detection system 105 can include one or more processors, multiple sensors, non-volatile storage, and other circuitry to provide desired safety monitoring and user interface features. Some user interface features may only be available in line powered embodiments due to physical limitations and power constraints. In addition, some features common to both line and battery powered embodiments may be implemented differently. Hazard detection system 105 can include the following power consuming components: low power wireless personal area network (LoWPAN) circuitry, a system processor, a safety processor, non-volatile memory (e.g., Flash), WiFi circuitry, an ambient light sensor (ALS), a smoke sensor, a carbon monoxide (CO) sensor, one or more temperature sensors, one or more ultrasonic sensors, a passive infra-red (PIR) sensor, a speaker, one or more LED's, and a buzzer. It is understood multiple instances of the same component may exist, whereas other components may only exist in one instance.

Hazard detection system 105 can monitor environmental conditions associated with enclosure 100 and alarm occupants when an environmental condition exceeds a predetermined threshold. The monitored conditions can include, for example, smoke, heat, humidity, carbon monoxide, carbon dioxide, radon, and other gasses. In addition to monitoring the safety of the environment, hazard detection system 105 can provide several user interface features not found in conventional alarm systems. These user interface features can include, for example, vocal alarms, voice setup instructions, cloud communications (e.g. push monitored data to the cloud, or push notifications to a mobile phone, receive commands from the cloud such as a hush command), device-to-device communications (e.g., communicate with other hazard detection systems in the enclosure, including the communication of software updates between hazard detection systems), visual safety indicators (e.g., display of a green light indicates it is safe and display of a red light indicates danger), tactile and non-tactile input command processing, and software updates.

It should be understood that hazard detection system 105 may be implemented as a smart home device. Thus, although the discussion of the hazard detection system is described primarily with reference to specific hazards (e.g., smoke, CO, heat), the hazard detection system may provide additional features and functionality unrelated to those hazards. For example, the hazard detection system may monitor many different conditions. These conditions can include motions, sounds, and smells. These conditions can also include data supplied by remote sensors (e.g., armbands, door sensors, window sensors, personal media devices).

Hazard detection system 105 can implement multi-criteria state machines according to various embodiments described herein to provide advanced hazard detection and advanced user interface features such as pre-alarms. In addition, the multi-criteria state machines can manage alarming states and pre-alarming states and can include one or more sensor state machines that can control the alarming states and one or more system state machines that control the pre-alarming states. Each state machine can transition among any one of its states based on sensor data values, hush events, and transition conditions. The transition conditions can define how a state machine transitions from one state to another, and ultimately, how hazard detection system 105 operates. Hazard detection system 105 can use a dual processor arrangement to execute the multi-criteria state machines according to various embodiments. The dual processor arrangement enables hazard detection system 105 to manage the alarming and pre-alarming states in a manner that uses minimal power while simultaneously providing relatively failsafe hazard detection and alarming functionality. Additional details of multi-criteria state machines can be found, for example, in commonly assigned U.S. Pat. No. 9,412,258, the disclosure of which is incorporated by reference herein its entirety.

Enclosure 100 can include any number of hazard detection systems. For example, as shown, hazard detection system 107 is another hazard detection system, which may be similar to system 105. In one embodiment, both systems 105 and 107 can be battery powered systems. In another embodiment, system 105 may be line powered, and system 107 may be battery powered. Moreover, a hazard detection system can be installed outside of enclosure 100.

Thermostat 110 can be one of several thermostats that controls HVAC system 120. Thermostat 110 can be referred to as the "primary" thermostat because it is electrically connected to actuate all or part of an HVAC system, by virtue of an electrical connection to HVAC control wires (e.g. W, G, Y, etc.) leading to HVAC system 120. Thermostat 110 can include one or more sensors to gather data from the environment associated with enclosure 100. For example, a sensor may be used to detect occupancy, temperature, light and other environmental conditions within enclosure 100. Remote thermostat 112 can be referred to as an "auxiliary" thermostat because it may not be electrically connected to actuate HVAC system 120, but it too may include one or more sensors to gather data from the environment associated with enclosure 100 and can transmit data to thermostat 110 via a wired or wireless link. For example, thermostat 112 can wirelessly communicate with and cooperates with thermostat 110 for improved control of HVAC system 120. Thermostat 112 can provide additional temperature data indicative of its location within enclosure 100, provide additional occupancy information, or provide another user interface for the user (e.g., to adjust a temperature setpoint).

Hazard detection systems 105 and 107 can communicate with thermostat 110 or thermostat 112 via a wired or wireless link. For example, hazard detection system 105 can wirelessly transmit its monitored data (e.g., temperature and occupancy detection data) to thermostat 110 so that it is provided with additional data to make better informed decisions in controlling HVAC system 120. Moreover, in some embodiments, data may be transmitted from one or more of thermostats 110 and 112 to one or more of hazard detections systems 105 and 107 via a wired or wireless link.

Central panel 130 can be part of a security system or other master control system of enclosure 100. For example, central panel 130 may be a security system that may monitor windows and doors for break-ins, and monitor data provided by motion sensors. In some embodiments, central panel 130 can also communicate with one or more of thermostats 110 and 112 and hazard detection systems 105 and 107. Central panel 130 may perform these communications via wired link, wireless link, or a combination thereof. For example, if smoke is detected by hazard detection system 105, central panel 130 can be alerted to the presence of smoke and make the appropriate notification, such as displaying an indicator that a particular zone within enclosure 100 is experiencing a hazard condition.

Enclosure 100 may further include a private network accessible both wirelessly and through wired connections and may also be referred to as a Local Area Network or LAN. Network devices on the private network can include hazard detection systems 105 and 107, thermostats 110 and 112, computer 124, and central panel 130. In one embodiment, the private network is implemented using router 122, which can provide routing, wireless access point functionality, firewall and multiple wired connection ports for connecting to various wired network devices, such as computer 124. Wireless communications between router 122 and networked devices can be performed using an 802.11 protocol. Router 122 can further provide network devices access to a public network, such as the Internet or the Cloud, through a cable-modem, DSL modem and an Internet service provider or provider of other public network service. Public networks like the Internet are sometimes referred to as a Wide-Area Network or WAN.

Access to the Internet, for example, may enable networked devices such as system 105 or thermostat 110 to communicate with a device or server remote to enclosure 100. The remote server or remote device can host an account management program that manages various networked devices contained within enclosure 100. For example, in the context of hazard detection systems according to embodiments discussed herein, system 105 can periodically upload data to the remote server via router 122. In addition, if a hazard event is detected, the remote server or remote device can be notified of the event after system 105 communicates the notice via router 122. Similarly, system 105 can receive data (e.g., commands or software updates) from the account management program via router 122.

Hazard detection system 105 can operate in one of several different power consumption modes. Each mode can be characterized by the features performed by system 105 and the configuration of system 105 to consume different amounts of power. Each power consumption mode corresponds to a quantity of power consumed by hazard detection system 105, and the quantity of power consumed can range from a lowest quantity to a highest quantity. One of the power consumption modes corresponds to the lowest quantity of power consumption, and another power consumption mode corresponds to the highest quantity of power consumption, and all other power consumption modes fall somewhere between the lowest and the highest quantities of power consumption. Examples of power consumption modes can include an Idle mode, a Log Update mode, a Software Update mode, an Alarm mode, a Pre-Alarm mode, a Hush mode, and a Night Light mode. These power consumption modes are merely illustrative and are not meant to be limiting. Additional or fewer power consumption modes may exist. Moreover, any definitional characterization of the different modes described herein is not meant to be all inclusive, but rather, is meant to provide a general context of each mode.

Figure 2:
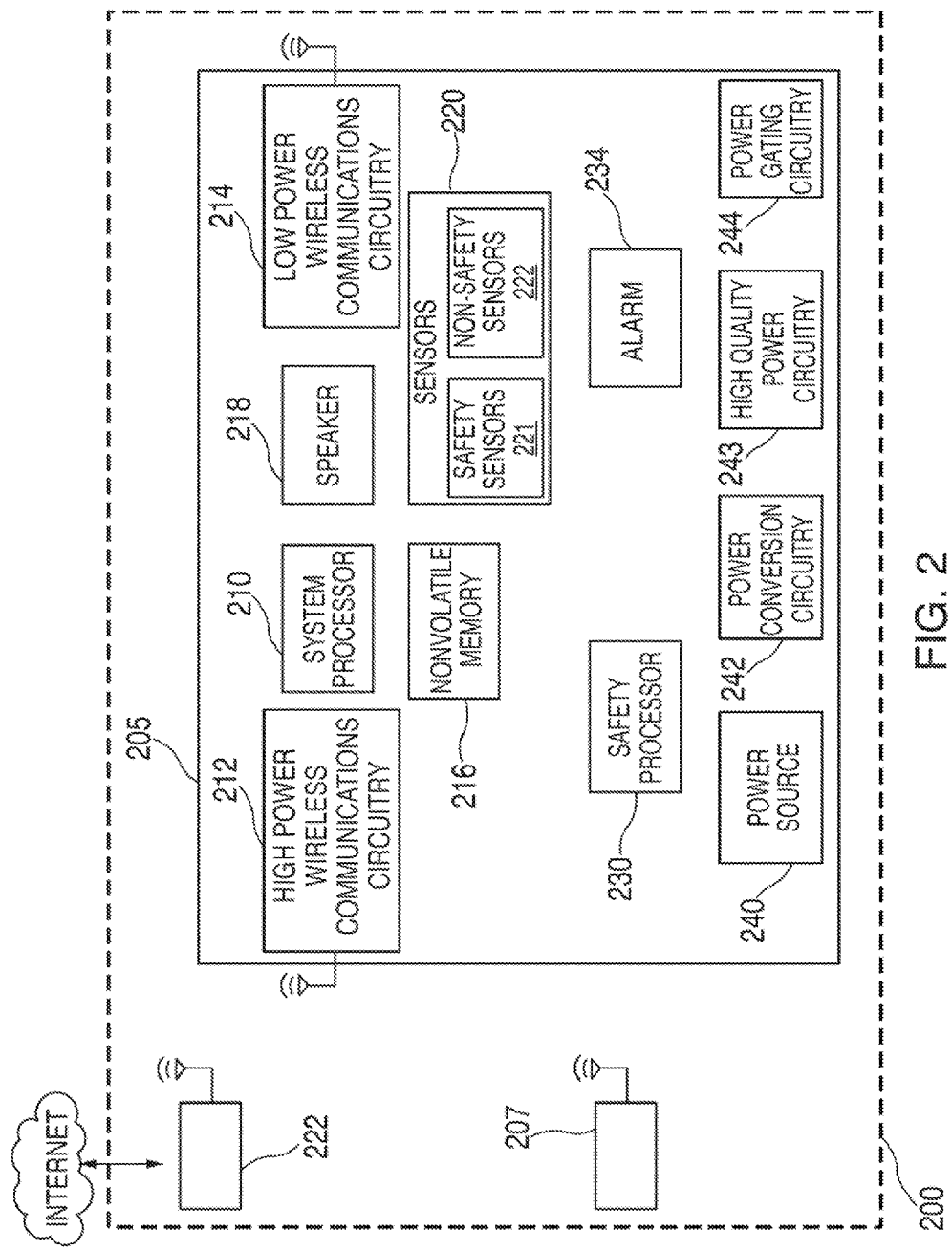
FIG. 2 shows an illustrative block diagram of a hazard detection system being used in an illustrative enclosure, according to some embodiments.

FIG. 2 shows an illustrative block diagram of hazard detection system 205 being used in an illustrative enclosure 200 in accordance with some embodiments. FIG. 2 also shows optional hazard detection system 207 and router 222. Hazard detection systems 205 and 207 can be similar to hazard detection systems 105 and 107 in FIG. 1, enclosure 200 can be similar to enclosure 100 in FIG. 1, and router 222 can be similar to router 122 in FIG. 1. Hazard detection system 205 can include several components, including system processor 210, high-power wireless communications circuitry 212 and antenna, low-power wireless communications circuitry 214 and antenna, non-volatile memory 216, speaker 218, sensors 220, which can include one or more safety sensors 221 and one or more non-safety sensors 222, safety processor 230, alarm 234, power source 240, power conversion circuitry 242, high quality power circuitry 243, and power gating circuitry 244. Hazard detection system 205 is operative to provide failsafe safety detection features and user interface features using circuit topology and power budgeting methods that minimize power consumption. The components of system 205 and an exemplary circuit topology are discussed in connection with FIGS. 2 and 3, and power budgeting methods are discussed in connection with FIGS. 5-9.

Hazard detection system 205 can use a bifurcated processor circuit topology for handling the features of system 205. Both system processor 210 and safety processor 230 can exist on the same circuit board within system 205, but perform different tasks. System processor 210 is a larger more capable processor that can consume more power than safety processor 230. That is, when both processors 210 and 230 are active, processor 210 consumes more power than processor 230. Similarly, when both processors are inactive, processor 210 still consumes more power than processor 230. System processor 210 can be operative to process user interface features and monitor interface sensors 220. For example, processor 210 can direct wireless data traffic on both high and low power wireless communications circuitry 212 and 214, access non-volatile memory 216, communicate with processor 230, and cause audio to be emitted from speaker 218. As another example, processor 210 can monitor interface sensors 220 to determine whether any actions need to be taken (e.g., shut off a blaring alarm in response to a user detected action to hush the alarm).

Safety processor 230 can be operative to handle safety related tasks of system 205, or other types of tasks that involve monitoring environmental conditions (such as temperature, humidity, smoke, carbon monoxide, movement, light intensity, etc.) exterior to the hazard detection system 205. Safety processor 230 can poll one or more of sensors 220 and activate alarm 234 when one or more of sensors 220 indicate a hazard event is detected. Processor 230 can operate independently of processor 210 and can activate alarm 234 regardless of what state processor 210 is in. For example, if processor 210 is performing an active function (e.g., performing a WiFi update) or is shut down due to power constraints, processor 230 can activate alarm 234 when a hazard event is detected. In some embodiments, the software running on processor 230 may be permanently fixed and may never be updated via a software or firmware update after system 205 leaves the factory.

Compared to processor 210, processor 230 is a less power consuming processor. Thus by using processor 230 in lieu of processor 210 to monitor a subset of sensors 220 yields a power savings. If processor 210 were to constantly monitor sensors 220, the power savings may not be realized. In addition to the power savings realized by using processor 230 for monitoring the subset of sensors 220, bifurcating the processors also ensures that the safety monitoring and core monitoring and alarming features of system 205 will operate regardless of whether processor 210 is functioning. By way of example and not by way of limitation, system processor 210 may comprise a relatively high-powered processor such as Freescale Semiconductor K60 Microcontroller, while safety processor 230 may comprise a relatively low-powered processor such as a Freescale Semiconductor KL15 Microcontroller. Overall operation of hazard detection system 205 entails a judiciously architected functional overlay of system processor 210 and safety processor 230, with system processor 210 performing selected higher-level, advanced functions that may not have been conventionally associated with hazard detection units (for example: more advanced user interface and communications functions; various computationally-intensive algorithms to sense patterns in user behavior or patterns in ambient conditions; algorithms for governing, for example, the brightness of an LED night light as a function of ambient brightness levels; algorithms for governing, for example, the sound level of an onboard speaker for home intercom functionality; algorithms for governing, for example, the issuance of voice commands to users; algorithms for uploading logged data to a central server; algorithms for establishing network membership; algorithms for facilitating updates to the programmed functionality of one or more elements of the hazard detection system 205 such as the safety processor 230, the high power wireless communications circuitry 212, the low power wireless communications circuitry 214, the system processor 210 itself, etc., and so forth), and with safety processor 230 performing the more basic functions that may have been more conventionally associated with hazard detection units (e.g., smoke and CO monitoring, actuation of shrieking/buzzer alarms upon alarm detection). By way of example and not by way of limitation, system processor 210 may consume on the order of 18 mW when it is in a relatively high-power active state and performing one or more of its assigned advanced functionalities, whereas safety processor 230 may only consume on the order of 0.05 mW when it is performing its basic monitoring functionalities. However, again by way of example and not by way of limitation, system processor 210 may consume only on the order of 0.005 mW when in a relatively low-power inactive state, and the advanced functions that it performs are judiciously selected and timed such that the system processor is in the relatively high power active state only about 0.05% of the time, and spends the rest of the time in the relatively low-power inactive state. Safety processor 230, while only requiring an average power draw of 0.05 mW when it is performing its basic monitoring functionalities, should of course be performing its basic monitoring functionalities 100% of the time. According to one or more embodiments, the judiciously architected functional overlay of system processor 210 and safety processor 230 is designed such that hazard detection system 205 can perform basic monitoring and shriek/buzzer alarming for hazard conditions even in the event that system processor 210 is inactivated or incapacitated, by virtue of the ongoing operation of safety processor 230. Therefore, while system processor 210 is configured and programmed to provide many different capabilities for making hazard detection unit 205 an appealing, desirable, updatable, easy-to-use, intelligent, network-connected sensing and communications node for enhancing the smart-home environment, its functionalities are advantageously provided in the sense of an overlay or adjunct to the core safety operations governed by safety processor 230, such that even in the event there are operational issues or problems with system processor 210 and its advanced functionalities, the underlying safety-related purpose and functionality of hazard detector 205 by virtue of the operation of safety processor 230 will continue on, with or without system processor 210 and its advanced functionalities.

High power wireless communications circuitry 212 can be, for example, a Wi-Fi module capable of communicating according to any of the 802.11 protocols. For example, circuitry 212 may be implemented using Broadcom part number BCM43362, available in a module from Murata. Depending on an operating mode of system 205, circuitry 212 can operate in a low power "sleep" state or a high power "active" state. For example, when system 205 is in an Idle mode, circuitry 212 can be in the "sleep" state. When system 205 is in a non-Idle mode such as Wi-Fi update mode, software update mode, or alarm mode, circuitry 212 can be in an active state. For example, when system 205 is in an active alarm mode, high power circuitry 212 may communicate with router 222 so that a message can be sent to a remote server or device.

Low power wireless communications circuitry 214 can be a low power Wireless Personal Area Network (6LoWPAN) module or a ZigBee module capable of communicating according to an 802.15.4 protocol. For example, in one embodiment, circuitry 214 can be part number EM357 SoC available from Silicon Laboratories. Depending on the operating mode of system 205, circuitry 214 can operate in a relatively low power "listen" state or a relatively high power "transmit" state. When system 205 is in the Idle mode, WiFi update mode (which may require use of the high power communication circuitry 212), or software update mode, circuitry 214 can be in the "listen" state. When system 205 is in the Alarm mode, circuitry 214 can transmit data so that the low power wireless communications circuitry in system 207 can receive data indicating that system 205 is alarming. Thus, even though it is possible for high power wireless communications circuitry 212 to be used for listening for alarm events, it can be more power efficient to use low power circuitry 214 for this purpose. Power savings may be further realized when several hazard detection systems or other systems having low power circuitry 214 form an interconnected wireless network.

Power savings is also realized because in order for low power circuitry 214 to continually listen for data transmitted from other low power circuitry, circuitry 214 must constantly be operating in its "listening" state. This state consumes power, and although it may consume more power than high power circuitry 212 operating in its sleep state, the power saved versus having to periodically activate high power circuitry 212 is substantial. When high power circuitry 212 is in its active state and low power circuitry 214 is in its transmit state, high power circuitry 212 consumes substantially more power than low power circuitry 214.

In some embodiments, low power wireless communications circuitry 214 can be characterized by its relatively low power consumption and its ability to wirelessly communicate according to a first protocol characterized by relatively low data rates, and high power wireless communications circuitry 212 can be characterized by its relatively high power consumption and its ability to wirelessly communicate according to a second protocol characterized by relatively high data rates. The second protocol can have a much more complicated modulation than the first protocol.

In some embodiments, low power wireless communications circuitry 214 may be a mesh network compatible module that does not require an access point or a router in order to communicate to devices in a network. Mesh network compatibility includes provisions that enable mesh network compatible modules to keep track of other nearby mesh network compatible modules so that data can be passed through neighboring modules. Mesh network compatibility is essentially the hallmark of the 802.15.4 protocol. In contrast, high power wireless communications circuitry 212 is not a mesh network compatible module and requires an access point or router in order to communicate to devices in a network. Thus, if a first device having circuitry 212 wants to communicate data to another device having circuitry 212, the first device has to communicate with the router, which then transmits the data to the second device. Thus, there is no device-to-device communication per se when circuitry 212 requires use of a router. In other embodiments, circuitry 212 can perform device-to-device communication using a Wi-Fi Direct communications protocol. The Wi-Fi Direct communications standard can enable devices to connect easily with each other without requiring a router. For example, an exemplary use of Wi-Fi Direct can enable hazard detection system 105 to directly communicate with thermostat 110.

Non-volatile memory 216 can be any suitable permanent memory storage such as, for example, NAND Flash, a hard disk drive, NOR, ROM, or phase change memory. In one embodiment, non-volatile memory 216 can store audio clips that can be played back by speaker 218. The audio clips can include installation instructions or warning in one or more languages. Speaker 218 can be any suitable speaker operable to playback sounds or audio files. Speaker 218 can include an amplifier (not shown).

Sensors 220 can be monitored by safety processor 230 (and, in some embodiments, system processor 210), and can include safety sensors 221 and non-safety sensors 222. One or more of sensors 220 may be exclusively monitored by one of system processor 210 and safety processor 230. As defined herein, monitoring a sensor refers to a processor's ability to acquire data from that monitored sensor. That is, one particular processor may be responsible for acquiring sensor data, and possibly storing it in a sensor log, but once the data is acquired, it can be made available to another processor either in the form of logged data or real-time data. For example, in one embodiment, system processor 210 may monitor one of non-safety sensors 222, but safety processor 230 cannot monitor that same non-safety sensor. In another embodiment, safety processor 230 may monitor each of the safety sensors 221, but provide the acquired sensor data (or some information indicative of the acquired sensor data) to system processor 210.

Safety sensors 221 can include sensors necessary for ensuring that hazard detection system 205 can monitor its environment for hazardous conditions and alert users when hazardous conditions are detected, and all other sensors not necessary for detecting a hazardous condition are non-safety sensors 222. In some embodiments, safety sensors 221 include only those sensors necessary for detecting a hazardous condition. For example, if the hazardous condition includes smoke and fire, then the safety sensors would only include a smoke sensor and at least one heat sensor. Other sensors, such as non-safety sensors, could be included as part of system 205, but would not be needed to detect smoke or fire. As another example, if the hazardous condition includes carbon monoxide, then the safety sensor would be a carbon monoxide sensor, and no other sensor would be needed to perform this task.

Thus, sensors deemed necessary can vary based on the functionality and features of hazard detection system 205. In one embodiment, hazard detection system 205 can be a combination smoke, fire, and carbon monoxide alarm system. In such an embodiment, detection system 205 can include the following safety sensors 221: a smoke detector, a carbon monoxide (CO) sensor, and one or more heat sensors. Smoke detectors detect smoke and typically use optical detection, ionization, or air sampling techniques. A CO sensor can detect the presence of carbon monoxide gas, which, in the home, is typically generated by open flames, space heaters, water heaters, blocked chimneys, and automobiles. The material used in electrochemical CO sensors typically has a 5-7 year lifespan, though some sensors may have lifespans that last 10 years or more. Thus, after CO sensor's life has expired, the CO sensor should be replaced. A heat sensor can be a thermistor, which is a type of resistor whose resistance varies based on temperature. Thermistors can include negative temperature coefficient (NTC) type thermistors or positive temperature coefficient (PTC) type thermistors. Furthermore, in this embodiment, detection system 205 can include the following non-safety sensors 222: a humidity sensor, an ambient light sensor, a push-button sensor, a passive infra-red (PIR) sensor, and one or more ultrasonic sensors. A temperature and humidity sensor can provide relatively accurate readings of temperature and relative humidity. An ambient light sensor (ALS) sensor detects ambient light and the push-button sensor can be a switch, for example, that detects a user's press of the switch. A PIR sensor can be used for various motion detection features. A PIR sensor can measure infrared light radiating from objects in its field of view. Ultrasonic sensors can be used to detect the presence of an object. Such sensors can generate high frequency sound waves and determine which wave(s) are received back by the sensor. Sensors 220 can be mounted to a printed circuit board (e.g., the same board that processors 210 and 230 are mounted to), a flexible printed circuit board, a housing of system 205, or a combination thereof.

In some embodiments, data acquired from one or more non-safety sensors 222 can be acquired by the same processor used to acquire data from one or more safety sensors 221. For example, safety processor 230 may be operative to monitor both safety and non-safety sensors 221 and 222 for power savings reasons, as discussed above. Although safety processor 230 does not need any of the data acquired from non-safety sensor 222 to perform its hazard monitoring and alerting functions, the non-safety sensor data can be utilized to provide enhanced hazard system 205 functionality. The enhanced functionality can be realized in alarming algorithms according to various embodiments discussed herein. For example, the non-safety sensor data can be utilized by system processor 210 to implement system state machines that interface with one or more sensor state machines, all of which are discussed in more detail below in connection with the description accompanying FIGS. 3-15.

Alarm 234 can be any suitable alarm that alerts users in the vicinity of system 205 of the presence of a hazard condition. Alarm 234 can also be activated during testing scenarios. Alarm 234 can be a piezo-electric buzzer, for example.

Power source 240 can supply power to enable operation of system 205 and can include any suitable source of energy. Embodiments discussed herein can include AC line powered, battery powered, a combination of AC line powered with a battery backup, and externally supplied DC power (e.g., USB supplied power). Embodiments that use AC line power, AC line power with battery backup, or externally supplied DC power may be subject to different power conservation constraints than battery only embodiments. Battery powered embodiments are designed to manage power consumption of its finite energy supply such that hazard detection system 205 operates for a minimum period of time. In some embodiments, the minimum period of time can be one (1) year, three (3) years or seven (7) years. In other embodiments, the minimum period of time can be at least seven (7) years, eight (8) years, nine (9) years, or ten (10) years. Line powered embodiments are not as constrained because their energy supply is virtually unlimited. Line powered with battery backup embodiments may employ power conservation methods to prolong the life of the backup battery.

In battery only embodiments, power source 240 can include one or more batteries or a battery pack. The batteries can be constructed from different compositions (e.g., alkaline or lithium iron disulfide) and different end-user configurations (e.g., permanent, user replaceable, or non-user replaceable) can be used. In one embodiment, six cells of Li—FeS$_2$ can be arranged in two stacks of three. Such an arrangement can yield about 27000 mWh of total available energy for system 205.

Power conversion circuitry 242 includes circuitry that converts power from one level to another. Multiple instances of power conversion circuitry 242 may be used to provide the different power levels needed for the components within system 205. One or more instances of power conversion circuitry 242 can be operative to convert a signal supplied by power source 240 to a different signal. Such instances of power conversion circuitry 242 can exist in the form of buck converters or boost converters. For example, alarm 234 may require a higher operating voltage than high power wireless communications circuitry 212, which may require a higher operating voltage than processor 210, such that all required voltages are different the voltage supplied by power source 240. Thus, as can be appreciated in this example, at least three different instances of power conversion circuitry 242 are required.

High quality power circuitry 243 is operative to condition a signal supplied from a particular instance of power conversion circuitry 242 (e.g., a buck converter) to another signal. High quality power circuitry 243 may exist in the form of a low-dropout regulator. The low-dropout regulator may be able to provide a higher quality signal than that provided by power conversion circuitry 242. Thus, certain components may be provided with "higher" quality power than other components. For example, certain safety sensors such as smoke detectors and CO sensors may require a relatively stable voltage in order to operate properly.

Power gating circuitry 244 can be used to selectively couple and de-couple components from a power bus. De-coupling a component from a power bus insures that the component does not incur any quiescent current loss, and therefore can extend battery life beyond that which it would be if the component were not so de-coupled from the power bus. Power gating circuitry 244 can be a switch such as, for example, a MOSFET transistor. Even though a component is de-coupled from a power bus and does not incur any current loss, the power gating circuitry itself may consume a finite amount of power. This finite power consumption, however, is less than the quiescent power loss of the component.

It is understood that although hazard detection system 205 is described as having two separate processors, system processor 210 and safety processor 230, which may provide certain advantages as described hereinabove and hereinbelow, including advantages with regard to power consumption as well as with regard to survivability of core safety monitoring and alarming in the event of advanced feature provision issues, it is not outside the scope of the present teachings for one or more of the various embodiments discussed herein to be executed by one processor or by more than two processors.

Figure 3:
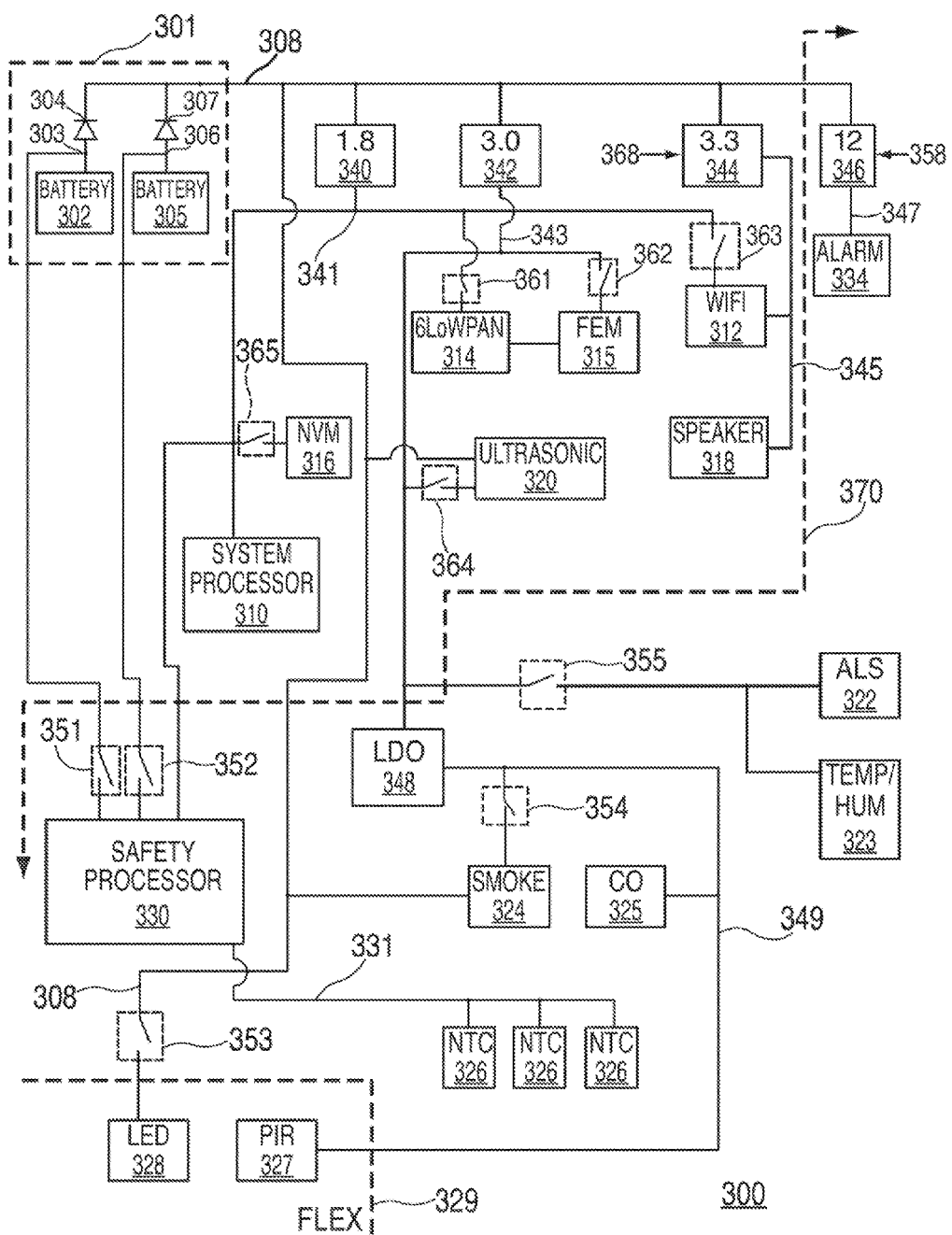
FIG. 3 shows an illustrative circuit schematic of a hazard detection system, according to some embodiments.

FIG. 3 shows an illustrative circuit schematic of hazard detection system 300 according to an embodiment. The circuit schematic is a more detailed illustrative representation of hazard detection system 205 (of FIG. 2) and shows, among other things, power consuming components, the power busses supplying power to the components, and gating circuitry for selecting coupling and de-coupling components to a power bus. Hazard detection system 300 can be powered solely by one or more batteries and uses a power budgeting scheme so that the one or more batteries can power system 300 for a minimum operational lifetime (e.g., of at least seven (7) years). The power budgeting scheme further enables system 300 to operate according to any one of several different modes (e.g., Idle, WiFi update, Software update, and Alarm) for a mode-specified period of time (e.g., WiFi update mode is performed once a day) during the minimum operational lifetime. In the discussion that follows, the circuit arrangement of system 300 illustrates how system 300 is able to manage its power consumption, while providing enhanced user interaction features as well as robust hazard detection.

Hazard detection system 300 includes battery system 301 operative to provide a DC power source to power bus 308. The DC power source can exist on power bus 308 at a first voltage level. The voltage level may change slightly depending on various conditions, such as changes in temperature. Depending on composition of DC power source (e.g., alkaline or Lithium-based chemistries), the voltage level can remain at a relatively constant voltage level (e.g., 4.5 volts) or it may remain within a pre-defined range of voltage levels during the operational life of system 300. The voltage level may drop substantially when the energy stored in battery system 301 falls below a predetermined threshold (e.g., when the batteries are effectively dead). Battery system 301 can include battery cell group 302 and battery cell group 305. Each of battery cell groups 302 and 305 can include one or more battery cells. In one embodiment, each cell group includes three battery cells. As shown, battery cell group 302 is coupled to diode 304 and to safety processor 330 via bus 303 and gating circuitry 351. Safety processor 330 is similar in many respects to safety processor 230 (discussed above in connection with FIG. 2). Battery cell group 305 is coupled to diode 307 and to safety processor 330 via bus 306 and gating circuitry 352. Safety processor 330 can temporarily close gating circuitries 351 and 352 to measure the voltages of battery groups 302 and 305, respectively. After the measurement is complete, safety processor 330 can open gating circuitry 351 and 352. Diodes 304 and 307 are coupled to power bus 308.

Power bus 308 is coupled to power converter circuitry 340, power converter circuitry 342, power converter circuitry 344, power converter circuitry 346, ultrasonic sensor 320, smoke detector 324, and display module 328 (e.g., light emitting diode (LED)) via power gating circuitry 353. As discussed above in connection with FIG. 2, power converting circuitry is operative to convert a signal from one level to another. Ultrasonic sensor 320 can be similar to the ultrasonic sensor referenced in connection with interface sensors 220 (of FIG. 2). Although only one ultrasonic sensor is shown, system 300 can include more than one ultrasonic sensor. In one embodiment, system 300 can include two ultrasonic sensors. For example, one ultrasonic sensor may be positioned within the housing of the system to detect ultrasonic events when mounted to a ceiling and the other sensor may be positioned within the house to detect ultrasonic events when mounted to a wall. Smoke detector 324 can be one of the safety sensors (as previously discussed). Display module 328 can be any suitable display apparatus. In one embodiment, display module 328 can include one or more LEDs that emit different colored light to signify a status of system 300. For example, display of green light can signify good status, orange light can signify a warning condition such as a low battery, and red light can signify a hazard condition. Each of the components power bus 308 is coupled to receive DC power at the first voltage level. Although ultrasonic sensor 320, smoke detector 324, and display module 328 can operate using DC power at the first voltage level, other components in system 300 can require different operating voltages. In addition, it is understood that although various components such as ultrasonic sensor 320, smoke detector 324, and display module 328 can receive power from power bus 308 at a first voltage level, one or more of these components may have internal power conversion circuitry. For example, ultrasonic sensor 320 and display module 328 can each include a boost converter.

Power converter circuitry 340, 342, 344, and 346 are each operative to convert the DC power signal provided on power bus 308 to a signal having a different voltage level. Power converter circuitry 340, 342, and 344 can all be operative to down convert the DC power signal to three different voltages levels lower than the first voltage level. More particularly, power converter circuitry 340 can be a buck converter that provides a signal having a second voltage level (e.g., 1.8 volts) to power bus 341. Power bus 341 is coupled to system processor 310 (e.g., which can be similar to processor 210 of FIG. 2), safety processor 330, 6LoWPAN module 314 (e.g., which can be similar to low power wireless communication circuitry 214 of FIG. 2) via power gating circuitry 361, WiFi module 312 (e.g., which can be similar to high power wireless communication circuitry 212 of FIG. 2) via power gating circuitry 363, and non-volatile memory 316 (e.g., which can be similar to non-volatile memory 216) via power gating circuitry 365.

Some of the sensors may include subcomponents that have separate power requirements, and as such, may need to be separately powered. Such sensors may be coupled to receive power from two or more power busses so that the subcomponents are supplied with the appropriate power. In some embodiments, one or more of the subcomponents of a sensor may be power gated ON and OFF. For example, smoke detector 324 can be an active sensor that "interrogates" air contained within a chamber with an active IR signal, and then measures the IR signal to see how much of that signal is scattered. Thus, in some embodiments, smoke detector 324 can include a smoke detection optical source (a first subcomponent) and a smoke detection optical sensor (a second subcomponent), with each of these components being separately powered. In particular, power bus 308 can provide power to the smoke detection optical source and power bus 343 can provide power to the smoke detection optical sensor via power gating circuitry 354. During operation of hazard detection system 300, the smoke detection optical sensor may be selectively powered via controlled coupling and de-coupling to power bus 343 by power gating circuitry 354. Although the smoke detection optical source is coupled to power bus 308, it may be turned ON and OFF in response to a driving signal (e.g., provided by safety processor 330). Thus, in this embodiment, power savings can be achieved by (1) signal driving the smoke detection optical source and by (2) power gating the smoke detection optical sensor.

As another example, ultrasonic sensor 320 can include a transmit/boost subcomponent and a transducer subcomponent, with each of these subcomponents being separately powered. The transmit/boost component may be coupled to receive power from power bus 308 and the transducer subcomponent may be coupled to receive power from power bus 349 via power gating circuitry 364. During operation of hazard detection system 300, for example, the transducer subcomponent may be power gated ON and OFF via power gating circuitry 364 and the transmit/boost subcomponent may be signal driven ON and OFF. Thus, although the transmit/boost subcomponent can be directly coupled to power bus 308, the transmit/boost subcomponent may not be turned ON unless it is signal driven ON (e.g., by a signal provided by system processor 310), thereby minimizing power consumption. Thus, power consumption by ultrasonic sensor 320 can be minimized using two different approaches: power gating and signal driving. It is understood that other sensors may utilize similar approaches to minimize power consumption and extend battery life. It is further understood that some sensors may not include subcomponents that are coupled to power gating circuitry, but such subcomponents can be turned ON and OFF via signal driving.

Power converter circuitry 342 can be a buck converter that provides a signal having a third voltage level (e.g., 3.0 volts) to power bus 343. Power bus 343 is coupled to RF Front-End Module (FEM) 315 via power gating circuitry 362, ultrasonic sensor 320 via power gating circuitry 364, both ALS sensor 322 and temperature and humidity sensor 323 via power gating circuitry 355, and low-drop out regulator 348. Ultrasonic sensor 320 receives power on power busses 308 and 343. RF FEM 315 operates in connection with 6LoWPAN module 314 and can include a power amplifier (PA) for transmitting data, a low-noise amplifier (LNA) for receiving data, an optional antenna switch, and an optional transmit/receive switch. The PA boosts the power of the transmitting signal to improve signal range and the LNA improves sensitivity when receiving a signal. 6LoWPAN module 314 can optionally leverage FEM 315 to improve its performance, but doing so incurs a power penalty. ALS sensor 322 and temperature and humidity sensor 323 can be similar to safety sensors 232 discussed above in connection with FIG. 2.

Power converter circuitry 344 can be a buck converter that provides a signal having a fourth voltage level (e.g., 3.3 volts) to power bus 345. Power converting circuitry 344 can be operative to be selectively turned ON and OFF, depending on a signal applied to node 368. The signal applied to node 368 can be provided by system processor 310. Power bus 345 can be coupled to WiFi module 312 and speaker 318. Speaker 318 can be similar to speaker 218 (discussed above in connection with FIG. 2). The fourth voltage level can be higher than the third voltage level. Even though WiFi module 312 and speaker 318 could operate using the third voltage level, use of the fourth voltage level results in a performance boost. The increased operating voltage can increase the wireless range of WiFi module 312 and increase the loudness of speaker 318. In some embodiments, power converter circuitry 344 can be omitted and WiFi module 312 and speaker 318 can be coupled to power bus 343. WiFi module 312 is coupled to power bus 341 via gating circuitry 363 to receive power for its digital circuitry, logic, and to communicate with system processor 310 and is coupled to power bus 345 to receive power for its radio and transceiver. Thus, as shown, WiFi module 312 can have its digital logic circuitry power gated ON and OFF by gating circuitry 363, and its radio and transceiver can be powered ON and OFF depending on whether power converter circuitry 344 is turn ON.

Power converting circuitry 346 can be operative to up convert the DC power signal to a voltage level higher than the first voltage level. Power converting circuitry 346 can be operative to be selectively turned ON and OFF, depending on a signal applied to node 358. Power converting circuitry 346 can be a boost converter that provides a signal having a fifth voltage (e.g., 12 volts) to power bus 347. Alarm 334 can be similar to alarm 234 (discussed above in connection with FIG. 2).

It is understood that although power converting circuitry 340, 342, 344, 346 were described above as having either a buck converting topology or boost converting topology, any suitable converting topologies can be used. For example, other DC-DC converting topologies such as buck-boost can be used. In addition, converting topologies that use transformers can be used, such as, for example, full-bridge forward converters, half bridge forward converters, single-ended converters, push pull converters, and clamp converters.

Low-dropout regulator 348 is operative to provide "high" quality, stable, power to power bus 349. Low-dropout regulator 348 can change the voltage level of the signal it receives on power bus 343 to provide a sixth voltage level to power bus 349. The quality of the signal on power bus 349 is higher than the quality of the signal on power bus 343. Signal quality can be measured by any number of different characteristics. A few characteristics include voltage ripple, deviations from an average voltage level, transient response, and noise.

In an explanation by way of example, assume that power converting circuitry 342 is operative to provide a signal having the third voltage level (e.g., 3.0 volts) to power bus 343 and regulator 348 changes the third voltage level to the sixth voltage level (e.g., 2.7 volts). During operation of system 300, power demands on power bus 343 may temporarily disrupt power converter circuitry 342's ability to provide a signal at the third voltage level. For example, if ultrasonic sensor 320 is turned ON, the current demanded by sensor 320 could cause the voltage of the signal provided to power bus 343 to momentarily drop below the third voltage level. Despite this drop in voltage level, regulator 348 is operative to maintain its output signal at the sixth voltage level, thereby ensuring all components coupled to power bus 349 continue to operate unaffected by changes in the signal on power bus 343.

Power bus 349 can be coupled to smoke detector 324 via power gating circuitry 354, CO sensor 325, and PIR sensor 327. CO sensor 325 can be one of the safety sensors 232 discussed above in connection with FIG. 2. CO sensor 325 may use an electrochemical sensor to detect CO gas. This particular type of sensor requires a relatively stable signal to function properly and it is also the type of sensor that must always be receiving power. The constant power requirement may be necessary because it takes too long for the sensor to stabilize and take accurate CO readings if power gated ON and OFF. CO sensor 325 receives a stable power signal from regulator 348 on power bus 349 and is not power gated, thereby operative to always receive power from power bus 349. PIR sensor 327 is another type of sensor that requires a relatively stable signal to function properly and must always be receiving power.

Smoke detector 324 is coupled to power busses 308 and 349. Power bus 308 powers an infrared (IR) LED and power bus 359 powers receiver and signal amplification circuitry. In some embodiments, power bus 308 can supply power to the IR LED (e.g., smoke detector optical source) through an adjustable LDO (not shown). This LDO can be selectively enabled by safety processor 330, and is only toggled when an LED pulse is required; safety processor 330 can provide a driving signal to the smoke detector optical source (to turn it ON and OFF) and it can also control operation of power gating circuitry 354 to selectively power the receiver and signal amplification circuitry. When an IR LED pulse is not required, the LDO is disabled, and power gating circuitry 354 decouples power bus 359 to the receiver and signal amplification circuitry (e.g., smoke detector optical detector). As a result, when the LDO is disabled and power gating circuitry 354 is OPEN, smoke detector 324 can have a minimal current draw (e.g., less than 1 µA).

System 300 can include one or more thermistors 326 situated in various locations within system 300. Thermistors 326 can be another one of the safety sensors as previously discussed in connection with FIG. 2. As shown, thermistors 326 are NTC type thermistors, though it is understood that other types of thermistors can be used. Thermistors 326 can be coupled to safety processor 330 via power bus 331. Safety processor 330 can selectively provide a power signal to power bus 331. For example, when safety processor 330 desires to take temperature readings from thermistor 326, it can provide power to power bus 331. After the reading is taken, processor 330 can shut off the power to power bus 331. In another embodiment, processor 330 can constantly supply power to power bus 331. It will be understood that any number of thermistors may be used in system 300 and that the thermistors may reside in different locations thereof. For example, in one embodiment, a single thermistor may reside on flex 329.

The various components and power busses of hazard detection system 300 can reside on one or more printed circuit boards or flexible printed circuit boards. In one embodiment, PIR sensor 327 and display module 328 can reside on flexible printed circuit board 329 and all other components can reside on a printed circuit board (not shown). In another embodiment, all components can reside on a printed circuit board.

FIG. 3 shows a dashed line 370 snaking between various components of system 300. Dashed line 370 demarcates an illustrative divide of components dedicated to providing 1) safety features and 2) enhanced features, and in particular, generally shows how power is managed by processors 310 and 330. Components generally associated with safety features are shown below dashed line 370 and components generally associated with enhanced features are shown above dashed line 370. Dashed line 370 further serves to illustrate the bifurcated processors embodiment in which safety processor 330 is dedicated to safety features and system processor 310 is dedicated to handling enhanced features as well as general system administration. As will be discussed in more detail below, dashed line shows that safety processor 330 manages power consumption of the "safety" components and system processor manages power consumption of the other components.

The safety features of system 300 are robust, power efficient, and operate without fail. To ensure the robust and power efficient use of the safety features, system 300 can operate as follows. Power converting circuitry 340 and 342 can be operative to always be ON (at least during intended and ordinary usage of system 300) throughout its minimum operational lifespan. There may be instances in which power converting circuitry 340 and 342 are not always ON, such as when the system 300 undergoes a fill power-cycle reset. This way, power supplied on power busses 341 and 343 is always available to downstream components. These components can include system processor 310, safety processor 330, non-volatile memory 316, low-dropout regulator 348, and the safety sensors (e.g., ALS sensor 322, temperature and humidity sensor 323, smoke detector 324, CO sensor 325, thermistors 326, and PIR sensor 327). That safety processor 330 and the safety sensors have access to power via always ON power converting circuitry 340 and 342 ensures that system 300 is constantly monitoring for hazard events.

Power savings can be realized because safety processor 330, as opposed to system processor 310, is dedicated to monitoring the safety sensors for a hazard condition. Additional power savings can be realized by power gating various components. In particular, safety processor 330 can independently control each of power gating circuits 353, 354, and 355. Thus, processor 330 can selectively couple and de-couple display module 328 to power bus 308, smoke detector 324 to power bus 349, and both ALS sensor 322 and temperature and humidity sensor 323 to power bus 353 by controlling power gating circuits 353, 354, and 355, respectively. Since display module 328, smoke detector 324, and both ALS sensor 322 and temperature and humidity sensor 323 can operate properly even when being fully turned ON and OFF, system 300 can further manage power consumption by selectively disconnecting them from their respective power busses. Further still, processor 330 can extract additional power savings by selectively providing power to power bus 331.

Safety processor 330 can further manage power consumption by selectively enabling power converting circuitry 346. Processor 330 can enable or disable circuitry 346 by applying the appropriate signal to control node 358. When converting circuitry 346 is enabled, it can provide a signal at the fifth voltage level to power bus 347. Processor 330 can enable circuitry 346 when a hazard event is detected, and once circuitry 346 is enabled, alarm 334 is operative to sounds its alarm. When no hazard event is detected or there is no need for alarm 334 to be active, processor 330 can disable circuitry 346. Disabling circuitry 346 saves power lost during the operation of circuitry 346 and as well as power that would otherwise be consumed by alarm 334.

Power management can also be exercised by processor 310. Processor 310 can independently control each of power gating circuits 361, 362, 363, 364, and 365. Thus, processor 310 can selectively couple and de-couple 6loWPAN module 314 to power bus 341, FEM 315 to power bus 343, WiFi module 312 to power bus 341, non-volatile memory 316 to power bus 341, and ultrasonic sensor 320 to power bus 343 by controlling power gating circuits 361, 362, 363, 364, and 365, respectively. These power-gating compatible components can be completely disconnected from a power bus and still be able to function properly when re-connected to their respective power busses.

System processor 310 can further manage power consumption by selectively enabling power converting circuitry 344. Processor 310 can enable or disable circuitry 344 by applying the appropriate signal to control node 368. When converting circuitry 344 is enabled, it can provide a signal at the fourth voltage level to power bus 345. Processor 310 can enable circuitry 344 when WiFi module 312 and speaker 318 require power. Disabling circuitry 344 saves power lost during the operation of circuitry 344 and as well as power that would otherwise be consumed by WiFi module 312 and speaker 318.

System processor 310 and safety processor 330 can operate according to several different power modes. For example, in a very simplistic sense, both processors 310 and 330 can operate in an active mode and a sleep mode. As another example, one or more of processor 310 and 330 can have multiple active modes and multiple sleep modes, each having a different power consumption level. The particular mode each processor operates in may depend on the mode operation of the system 300. For example, if system 300 is in an Idle mode of operation, system processor 310 may be a relatively deep sleep mode, and safety processor 330 may be in a relatively low power active mode.

FIG. 4 shows an illustrative state diagram indicating the ON/OFF states of power gating circuitry 353, 354, 355, 361, 362, 363, 364, and 365 and power converting circuitry 344 and 346 for four different modes of operation of system 300. The different modes include Idle, WiFi update, Software Update, and Alarm. It is understood that other modes can be implemented by system 300, but only four of such modes are shown to avoid overcrowding the FIG. In the FIG., power gating circuitry 353 is referenced as PGC 353, circuitry 354 is referenced as PGC 354, and so on. Power converting circuitry 344 is referenced as PCC 344 and so on. When power gating circuitry is ON, it couples a power bus to a component. When a power gating circuitry is OFF, it de-couples a power bus from a component. When power converting circuitry is ON, it is functioning to convert a signal, and when it is OFF, it is not functioning. In some modes of operation, some power gating circuitry and power converting circuitry can be permanently ON or OFF throughout the duration of the mode, and other gating circuitry and converting circuitry can be cycled ON and OFF throughout the duration of the mode. The ON and OFF cycling is designated as CYCLED ON/OFF.

The hazard detection system can enforce a power budgeting scheme so that a battery power source can power the system for a minimum operational lifetime. In some embodiments, the battery power source is the sole source of energy for the system and is not rechargeable. In such systems, the power budgeting scheme may aggressively conserve power so that it can run for the minimum operational lifetime. The minimum operational lifetime can be a minimum of five years, six years, seven years, eight years, nine years, or ten years. In other embodiments, where the battery power source can be recharged, replaced, or used as a backup energy source, the power budgeting scheme may be operative to conserve power, but not as aggressively as it would be for a non-rechargeable, battery only system. For ease and clarity of discussion, the following power budgeting scheme discussion is made in reference to a non-rechargeable, non-replaceable, battery only hazard detection system, though it is understood that the power budgeting scheme or aspects thereof can be used in other hazard detection systems (including line powered systems, line powered with battery backup systems, and rechargeable battery powered systems). For example, a line powered hazard backup system is discussed below in connection with FIGS. 13-15.

The power budgeting schemes according to various embodiments further enhance the power savings realized using various power circuit embodiments discussed herein by imposing mode-specified run-time constraints on or more modes of operation. Each mode (e.g., Idle mode, Log Update mode, Software Update mode, and Alarm mode) has its own power consumption profile. The power consumption profile for a given mode defines the amount of power required to operate the hazard detection system according to that mode. Thus, when the hazard detection system is operating in one of the modes, its circuitry (e.g., the components shown in FIG. 3) is configured to operate according to that mode, and the power it consumes is indicative of that modes' power consumption profile.

The power consumption profile for each mode is different, and the quantity of power consumed in each mode can range from a lowest quantity to a highest quantity. One of the power consumption modes corresponds to the lowest quantity of power consumption, and another power consumption mode corresponds to the highest quantity of power consumption, and all other power consumption modes fall somewhere between the lowest and the highest quantities of power consumption. For example, in the Idle mode, the power consumption profile can be on the order of microwatts. The Log Update and Software Update modes can have power consumption profiles on the order of milliwatts, and the Alarm mode can have a power consumption profile on the order of watts. The differences in power consumption profiles can thus vary relative to each other. For example, the power consumption profile of the Idle mode can be relatively low compared to the power consumption profiles of the other modes. In particular, the Idle mode's power profile can be several orders of magnitude (e.g., three orders) less than the other modes. The Active mode's power profile can be relatively high compared to the other modes. It may be several orders of magnitude more than the Idle mode, but only one or two magnitudes higher than the Log Update and Software Update modes. The Log Update and Software Update modes can have power consumption profiles that are on the same order of magnitude but differ in that the Software Update mode consumes more power than the Log Update mode.

The power budgeting scheme can apply a mode-specified run-time constraint to one or more modes of operation. The mode-specified run-time constraint can limit how long the hazard detection system can operate in a particular mode. The time constraint for each mode can be on the order of seconds per day or minutes per year, or there can be no limit at all. FIG. 5 shows a mode-specified run-time constraint column illustrating the degree to which the hazard detection system can operate in any given mode. In addition, this column includes examples of how long (in seconds per year) the hazard detection system can operate for each mode. FIG. 5 also includes a column that indicates the operational duty cycle during the operational lifetime (e.g., ten years) of each mode. The operational duty cycle is a function of the run-time constraints and the operational lifetime. For example, if the run-time constraint for a particular mode is unconstrained, then the duty cycle would be 100% for the duration of the operational life. That is, the hazard detection system would consume power (at the rate of consumption for that mode) constantly throughout the operational life. If the run-time constraint for another mode is severely constrained, then the duty cycle for that mode would be a fraction of the operational life. Thus, for this mode, the hazard system would consume power (at the rate of consumption for that mode) intermittently throughout the operational life.

The power budgeting scheme can selectively apply run-time constraints to one or more modes of operation. For example, in some embodiments, a run-time constraint, at least initially, can be imposed on a particular mode of operation. Then, at a later time, that run-time constraint can be lifted. The run-time constraint can be lifted in response to any suitable number of different factors. One exemplary factor can be that the system requires heavy usage of that mode. Thus, instead of imposing the nm-time constraint, which prevents the system from being able to operate in that mode, it is lifted. The power budgeting scheme can compensate for de-selected run-time constraint by applying selectively applying one or more run-time constraints to one or more other modes of operation.

It should be appreciated that the system can exercise complete control over when some modes of operation are executed (e.g., such as Log Update and Software Update modes), but has no control over when other modes are executed (e.g., such as pre-alarm or alarm modes). In order to accommodate this potential for variability in mode operation, the power budgeting scheme can assign initial run-time constraints to each mode of operation, and based on system usage and other parameters (e.g., available battery capacity), it can adjust the run-time constraints. This way, the system can be initially configured to operate based on hypothetical estimates of how much power will be consumed by the system. And thus, if the actual power usage mimics the hypothetical estimates, the run-time constraints may remain relatively unchanged throughout the operational life of the system. However, if the actual power usage varies from the hypothetical estimates, the power budgeting scheme can adjust one or more of the run-time constraints.

In some usage case scenarios, the power budgeting scheme can fully accommodate variations in power consumption and still be able to ensure that the system operates for at least a minimum period of time. It can do this, for example, by imposing more stringent run-time constraints on one or more "controllable" modes. For example, if the system is operating in the alarm mode more than expected, the power budgeting scheme may impose stronger run-time constraints on the Log and Software update modes to ensure that the system operates for at least a minimum period of time. In other usage scenarios, the power budgeting scheme may not be able to ensure that the system operates for at least a minimum period of time when the power consumption grossly exceeds hypothetical estimates. For example, if the system operates in the alarm mode for multiple extended periods of times, this may result in a power drain on the system's battery to an extent that prevents it from powering system for its desired minimum operational life, regardless of how aggressively the run-time constraints are imposed on the other states.

Referring now to FIG. 5, an illustrative chart shows the relative power consumption profiles for each mode. As shown, relative power consumption profiles are assigned relative values as follows: Idle is LOW, Log Update is MEDIUM, Software Update is MEDIUM/HIGH, and Alarm is HIGH. FIG. 5 also illustrates very generally the different run-time constraints that can be applied to each mode. These run-time constraints can be, for example, an initial set of constraints imposed by the power budgeting scheme to ensure the hazard detection system operates throughout a desired operational life. One or more of these constraints may change, as needed. FIG. 5 also shows illustrative duty cycles of each mode. As shown, the Idle mode can have an unconstrained mode-specified run-time constraint. This means that whatever components are needed to enable the Idle mode are active throughout the operational life of the hazard detection system. For example, during Idle mode, the safety sensors may be actively polled to check for hazard conditions and to log sensor data.

The Log Update mode can have a moderate run-time constraint. For example, under this constraint, the hazard detection system can upload its log data to a remote server via a router (e.g., router 122 of FIG. 1) using high power wireless communications circuitry once a day for the entire duration of the operational lifetime. Although several components, including relatively high power consuming system processor and wireless communications circuitry, are temporarily active, the hazard detection system Log Update mode of operation accounts for less that 0.05% of operational lifetime.

The Software Update mode can have a severe run-time constraint. For example, under this constraint, the hazard detection system may be permitted one software update per year for the duration of the operational lifetime. Even though the Software Update mode has a MEDIUM/HIGH relative power consumption profile, the run-time constraint results in a relatively low duty cycle during the operational life (e.g., less than 0.0006%).

The Alarm mode can also have a severe run-time constraint. For example, under this constraint, sufficient power is preserved for regular testing of the alarm and for ensuring that the alarm will function upon detection of a hazard event.

Despite the Alarm mode's HIGH power consumption profile, its mode-specified run-time constraint results in a relatively low duty cycle during the operational life (e.g., less than 0.00095%). The power budgeting scheme can adjust the run-time constraints of the Log Update, Software Update, Alarm modes, and other modes, as desired, but may not be able to change run-time constraints for the Idle mode.

Turning now to FIG. 6, the chart shows illustrative power states of many of the power consuming components for each mode of operation. In particular, the chart shows the following power consuming components: 6LoWPan module, system processor, non-volatile memory, safety processor, WiFi module, ALS sensor, Smoke detector, CO sensor, Temperature and Humidity sensor, Ultrasonic sensor, PIR sensor, Speaker, LEDs, and Alarm. For each mode (e.g., Idle, Log Update, Software Update, and Alarm), the chart shows the power state a particular component is operating in, and an illustrative duty cycle. All of the values shown in FIG. 6 are merely illustrative.

The power states of each device are sufficiently self-explanatory, however, a slightly more detailed description of each state is now discussed. The Listen mode can be a state in which the 6LoWPAN module is operative to temporarily turn ON so that can "listen" for signals transmitted from another 6LoWPAN module. For example, the 6LoWPAN module (e.g., 6LoWPAN module 314 of FIG. 3) can turn ON for 3 milliseconds every 3 seconds to "listen." The Transmit mode can be a state in which the 6LoWPAN module actively transmits data so that other 6LoWPAN modules. For example, 6LoWPAN module 314 and FEM 315 are both turned ON to transmits data during the transmit power state.

The Data Collection power state is one in which the system processor can operate to receive data from various sources. For example, the system processor may receive data from one or more sensors and/or from the safety sensor. The data collected can be transmitted during a log update. The Log Update power state can be a state in which the various components are operative to transmit log data to a remote source (e.g., such as a remote server via router 122 of FIG. 1). The system processor (e.g., processor 310) and the WiFi module (e.g., WiFi module 312) can both operate in the log update power state. The Software Update power state can be a state in which the various components are operative to perform a software update. The system processor, non-volatile memory, safety processor, and WiFi module may operate in the software power state.

The Sensor Check power state is a state in which the various components are operative to perform a monitoring operation of a sensor. For example, with respect to sensors themselves (e.g., smoke detector or CO sensor), the sensor check power state represents the power consumed by each sensor. For example, with respect to the safety processor, the sensor check power state represents the power consumed by the processor to perform its sensor monitoring operations. These sensor monitoring operations can include polling active sensors, selectively activating one or more sensors to poll information from them, and storing the polled data in local memory for inclusion in an update log.

The Sleep power state is a state in which a component is in a minimal power consuming state. For example, the non-volatile memory, WiFi module, ultrasonic sensor, and speaker can all operate in the Sleep power state. The Alarm active power state is a state in which one or more components are operative to perform an alarm alerting function. For example, the system processor, non-volatile memory, safety processor, WiFi module, Smoke detector, CO sensor, Temperature and Humidity sensor, Ultrasonic sensor, PIR sensor, Speaker, LEDs, and Alarm can operate in an alarm active power state. The Alive indicator power state is a state in which the LEDs are operative to display a signal indicative that the hazard detection device is functioning properly.

FIG. 6 also shows illustrative duty cycles for each mode of operation. The duty cycle for the Idle mode of operation can, for example, be constant, thereby resulting in a 100% duty cycle. The duty cycles for the Log Update and Software Update modes can each be assigned an initial duty cycle, demarcated as $D_{LU\_0}$ and $D_{SW\_0}$, respectively, where the 0 represents an initial duty cycle value. As operating conditions change, the duty cycles for one or both of these modes may become variable. The variable nature of duty cycles are demarcated as $D_{LU\_V}$ and $D_{SW\_V}$, respectively, where the V represents a variably duty cycle. The duty cycle for the Alarm mode can be based on an as needed basis. Even though the power budgeting module according to various embodiments can estimate how often the system may operate in the Alarm mode (or a pre-alarm mode), the system is not bound by these estimates and is free to operate in the Alarm mode however it deems fit. As such, the duty cycle, $D_A$, for the Alarm mode, is variable in the sense that it dictated by the system's detection of hazardous events.

The power consumption values shown in FIG. 6 can be determined using any number of approaches. In one approach, the values can be obtained from product specification sheets. In another approach, the values can be determined through testing in a laboratory or factory. In yet another approach, the hazard detection system can monitor itself to determine power consumption values of one or more power consuming components. Regardless of how the values are ascertained, they can used as factors by the power budgeting scheme according to various embodiments.

Figure 7:
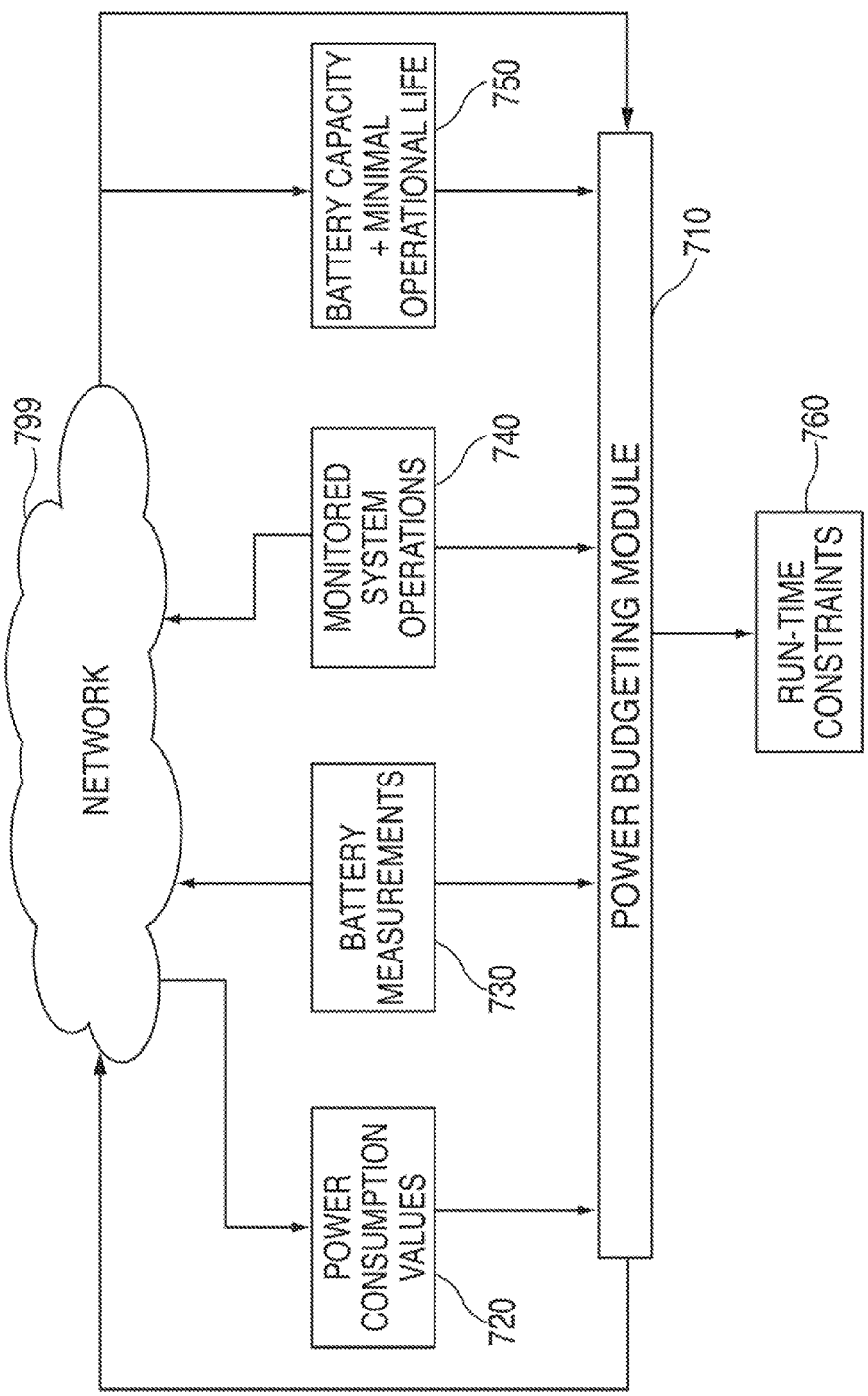
FIG. 7 shows an illustrative block diagram of a power budgeting scheme, according to some embodiments.

FIG. 7 shows an illustrative block diagram of a power budgeting scheme according to an embodiment. As shown, the scheme can include power budgeting module 710, power consumption values 720, battery measurements 730, monitored system operations 740, battery capacity and minimum operational life 750, run-time constraints 760, and network 799. Network 799 represents an external network such as the Internet that can be accessed by the hazard detection system. Power budgeting module 710 is representative of software running on the hazard detection system that manages a power budgeting scheme. Power budgeting module 710 receives several inputs (e.g., power consumption values 720, battery measurements 730, monitored system operations 740, battery capacity and minimum operational life 750) and provides an output (e.g., run-time constraints 760) based on the inputs. The inputs are now discussed.

Power consumption values 720 include average power consumption values of one or more components operating within the hazard detection system. The average power consumption values can include values for mode based power consumption on a system wide level (e.g., average total power consumed by the system during the Idle mode, Log Update mode, Alarm mode, and other modes). The average power consumption values can also include values for power consumption for each component for each mode of operation (e.g., average power consumed by the system processor during the Idle mode, Log Update mode, Alarm mode, and other modes). These values can include, for example, those discussed above in connection with FIG. 6. Power consumption values 720 can remain fixed throughout the operational life of the hazard detection system or one or more of the values can be updated. For example, one or more values can be updated during a software update in which data is received from network 799.

Battery measurements 730 include values obtained by monitoring battery power source. Because batteries exhibit known discharge curves, the battery measurements can provide a reliable indication of the status of the battery power source. Any suitable array of measurements may be taken on the battery power source. The measurements can include characteristics such as voltage, current, and resistance. Multiple samples of each characteristic can be measured at regular intervals. This can provide average values. For example, referring briefly to FIG. 3, safety processor 330 can measure the voltage of battery 302 and 305 via lines 303 and 306, respectively, by temporarily closing gating circuitry 351 and 352. To obtain an average sampling, the safety processor 330 can take multiple voltage measurements within a predetermined period of time. Referring back to FIG. 7, battery measurements 730 can be provided to power budgeting module 710 and optionally to network 799.

Monitored system operations 740 include data regarding hazard detection activity, and this data can be provided to power budgeting module 710 and optionally to network 799. The data can represent any level of system activity ranging, for example, from the number of times a particular safety sensor has been monitored to the number of times a log update is performed per day, and the data can include the duration of each activity. In one embodiment, the monitored system operations can include the number and duration of each mode of operation. For example, if the system operates in an Alarm mode, the monitored system operations can keep track of how long each alarm lasted. In another embodiment, the monitored system operations can include the number of times and duration of each component is active. For example, the monitored system operations can keep track of the duration each active WiFi module operation.

Battery capacity and minimum operational life 750 can specify the capacity of the battery power source and the minimum expected operational life of the batter power source. Both of these values can be provided to power budgeting module 710. In some embodiments, the values can be permanently stored. In other embodiments, the values can be updated during a software update in which data is received from network 799.

The output of power budgeting module 710 can include run-time constraints 760 and are a function of at least one or more of power consumption values 720, battery measurements 720, monitored system operations 740, and battery capacity and minimum operational life 750. Power budgeting module 710 can optionally provide data to network 799. Run-time constraints 760 can be similar to the mode-specified run-time constraints discussed above in connection with FIG. 5. Run-time constraints 760 can be a factor in defining a duty cycle for each mode of operation.

Power consumption values 720 and minimum operational life 750 both include values that remain relatively fixed throughout the operational life of the hazard detection system, although they can be optionally updated as discussed above. As such, they provide relative constants in the power budgeting scheme. Battery measurements 730 and monitored system operations 740 are relatively dynamic throughout the operational life. As such, they provide variables in the power budgeting scheme.

Power budgeting module 710 can continuously balance the variables (e.g., battery 730 and system operations 740) against the constants (e.g., power consumption variables 720 and operational life 750) to set and adjust run-time constraints 760. At the beginning of the hazard detection system's life, power budgeting module 710 can assign an initial set of run-time constraints (e.g., such as the constraints shown in FIG. 5). This initial set of run-time constraints are set to ensure that the system operates according to all desired modes for the minimum operational life. As the system ages and additional data is collected, power budgeting module 710 can assign an updated set of run-time constraints. The frequency in which power budgeting module 710 updates run-time constraints can be fixed or dynamic. In the fixed approached, power budgeting module 710 can update the constraints every predetermined interval. In the dynamic approach, power budgeting module 710 can update the constraints on an as needed basis.

Power budgeting module 710 can operate locally on the hazard detection system and independent of any external factors. For example, even though the hazard detection system is capable of receiving data from an external server (via router 122 of FIG. 1) that could cause power budgeting module 710 to modify its power management scheme, it can choose to ignore this externally supplied data and operate using only its locally generated data. Thus, in this embodiment, any externally supplied data received by way of network 799 has no bearing on how power budgeting module 710 enforces its power management scheme.

In another embodiment, power budgeting module 710 can operate in conjunction with external factors such as, for example, data supplied by network 799. For example, data received via network 799 can be used directly by module 710 (as evidenced by the line connecting network 799 to module 710) or indirectly by using updated values provided to power consumption values 720 and/or updated battery capacity and minimum operational life 750 to modify the power management scheme. This embodiment enables power budgeting module 710 to leverage remote server processing power (via network 799) to adjust run-time constraints 760 based on locally acquired battery measurements 730 and monitored system operations 740. In addition, because the same remote server can receive data from a large number of other hazard detection systems, the remote server has a large database from which it can leverage to generate data that is directly applicable to module 710. For example, the remote server may have acquired data indicating that the initial run-time constraint for a particular mode has been set to a value that may result in premature battery power source death. In response, the remote server can provide data to power budgeting module 710 (via network 799) to update the run-time constraint for that particular mode to ensure the minimum operational life is met.

Figure 8:
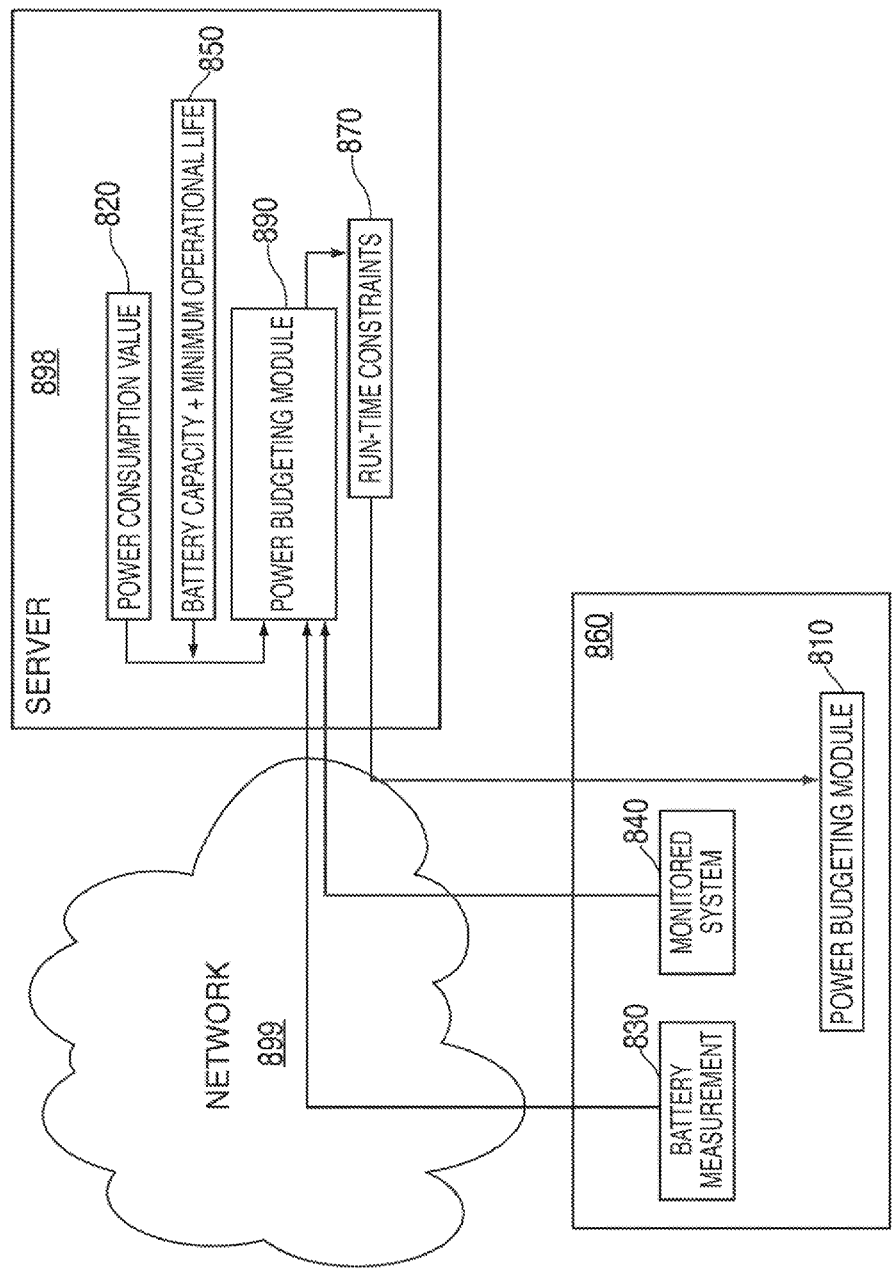
FIG. 8 shows an illustrative block diagram of another power budgeting scheme, according to some embodiments.

FIG. 8 shows an illustrative block diagram of a power budgeting scheme according to another embodiment. FIG. 8 is similar in many respects to FIG. 7, except that the run-time constraints are calculated solely by a power budgeting module operating in remote server 898. In this embodiment, server side power budgeting module 890 receives battery measurements 830 and monitored system operations 840 via network 899. Power consumption values 820 and minimum operation life 850 may be maintained on remote server 898. In this embodiment, server side power budgeting module 890 can provide updated run-time constraints 860 to client side power budgeting module 810 operating on hazard detection device 800 to enforce the appropriate power management scheme.

Figure 9:
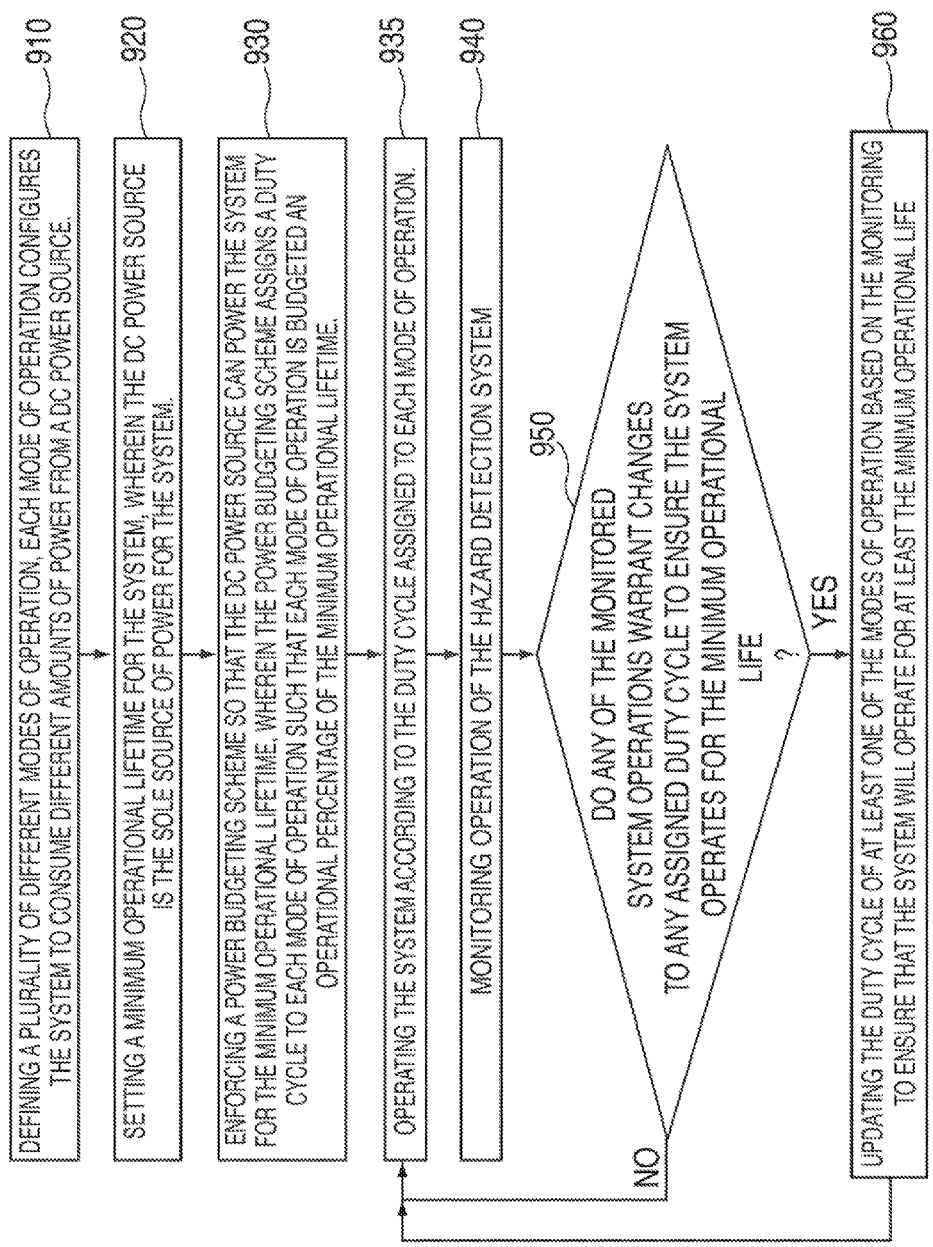
FIG. 9 shows an illustrative flowchart of steps to enforce a power management scheme, according to some embodiments.

FIG. 9 shows an illustrative flowchart of steps to enforce a power management scheme according to an embodiment. Beginning with step 910, several different modes of operation are defined. Each mode of operation can configure a hazard detection system to consume different amounts of power. The power being consumed can be supplied from a DC power source such as a battery power source. In some embodiments, the DC power source is the sole source of power for the system. At step 920, a minimum operational lifetime for the system can be set. For example, the minimum operation lifetime can be at least 5, 6, 7, 8, 9, or 10 years. As another example, the minimum operational lifetime can be at least the time duration of an electrochemical CO sensor, which is used as one of the safety sensors of the detection system.

At step 930, a power budgeting scheme is enforced so that the DC power source can power the system for the minimum operational lifetime. The power budgeting scheme assigns a duty cycle to each mode of operation such that each mode of operation is budgeted an operational percentage of the minimum operational lifetime. The duty cycle assigned to each mode limits how long the system can operate in that mode. At step 935, the system operates according operating the system according to the assigned duty cycle for each mode of operation.

At step 940, system operations are monitored. Monitored system operations include data regarding hazard detection system activity, as discussed above in connection with FIG. 7. At step 950, the power budgeting scheme can determine whether any of the monitored system operations warrant changes to any duty cycle to ensure the system operates for the minimum operational life. If the determination is NO, the process loops back to step 935. If the determination is YES, the process proceeds to step 960, in which the power budgeting scheme updates at least one of the mode-specified run-time constraints to ensure that the system will operate for at least the minimum operational life. After step 960, the process loops back to step 935.

Figure 10:
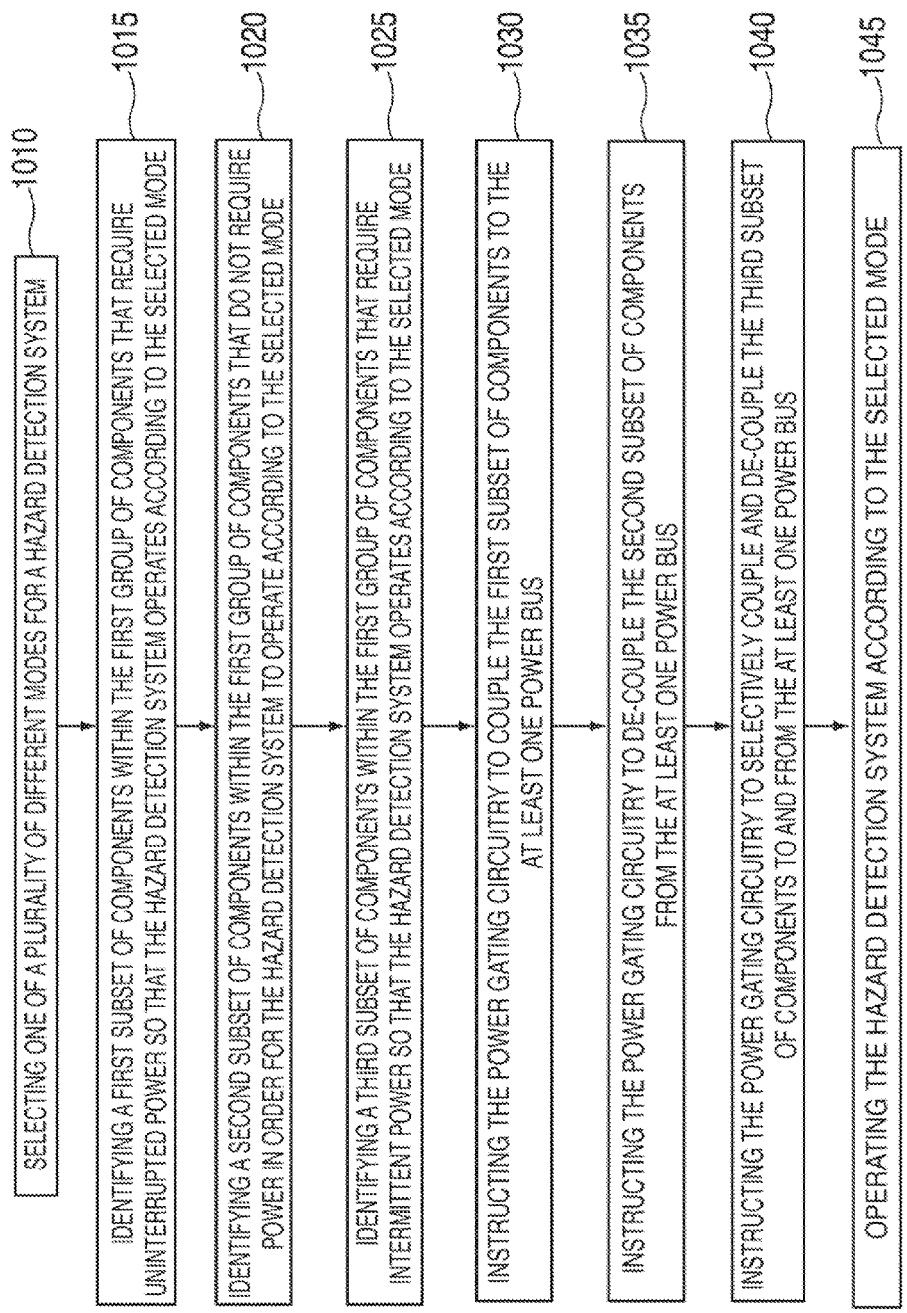
FIG. 10 shows an illustrative flowchart of steps that may be taken to selectively power gate components in a hazard detection system, according to some embodiments.

FIG. 10 shows an illustrative flowchart of steps that may be taken to selectively power gate components in a hazard detection system. The hazard detection system can be similar to that discussed above in connection with FIGS. 2 and 3. In particular, the system can include at least one power bus (e.g., power busses 308, 341, 343, and 349). The system can include a first group of components that are operable to be power gated ON and OFF, such as, for example, WiFi module 312, FEM 315, non-volatile memory 316, display module 328, smoke detector 324, ALS sensor 322 and temperature and humidity sensor 323. Thus, the first group includes at least one hazard sensor. The system includes power gating circuitry that selectively couples and de-couples the first group of components to the at least one power bus. The system further includes a second group of components that are not operable to be power gated ON and OFF, and the second group of components can be coupled to the at least one power bus. The second group can include, for example, CO sensor 325 and PIR 327. The second group of components can include at least one hazard sensor.

Starting at step 1010, the hazard detection system selects one of a plurality of different operating modes. At step 1015, a first subset of components within the first group of components is identified that require uninterrupted power so that the hazard detection system operates according to the selected mode. At step 1020, a second subset of components within the first group of components is identified that do not require power in order for the hazard detection system to operates according to the selected mode. At step 1025, a third subset of components within the first group of components that require intermittent power is identified so that the hazard detection system operates according to the selected mode. For example, when the selected mode is an idle mode, the first subset can be empty, the second subset can include at least one of the components within the first group, and the third subset can include the first hazard sensor The third subset can also include wireless communications circuitry (e.g., FEM 315). As another example, when the selected mode is a log update mode, the first subset can include a WiFi module, the second subset can include at least one of the components within the first group, and the third subset can include the first hazard sensor. As yet another example, when the selected mode is an Alarm mode, the first subset can include first wireless communications circuitry, second wireless communications circuitry, non-volatile memory, and an ultrasonic sensor; the second subset is empty and the third subset can optionally include the first hazard sensor.

At step 1030, the power gating circuitry is instructed to couple the first subset of components to the at least one power bus. At step 1035, the power gating circuitry is instructed to de-couple the second subset of components from the at least one power bus. Then at step 1040, the power gating circuitry is operative to selectively couple and de-couple the third subset of components to and from the at least one power bus. At step 1045, the hazard detection system operates according to the selected mode.

Figure 11:
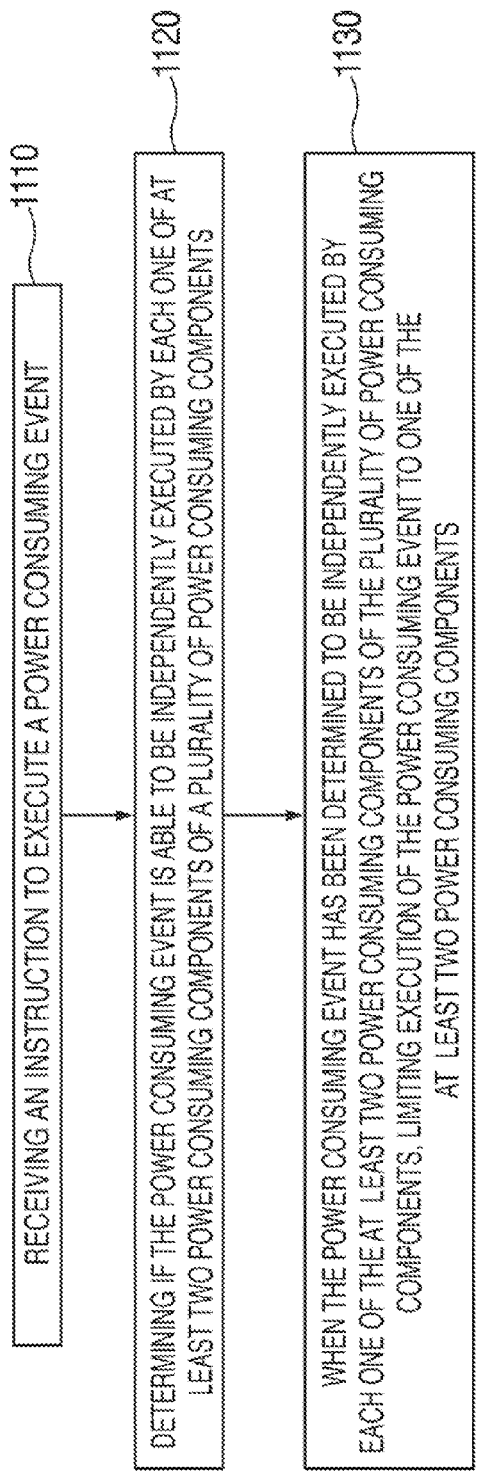
FIG. 11 shows an illustrative flowchart of steps that may be taken to limit peak power consumption during the operation of a hazard detection system, according to some embodiments.

FIG. 11 shows an illustrative flowchart of steps that may be taken to limit peak power consumption during the operation of a hazard detection system. A peak power limiting scheme may be enforced to prevent excessive current draw from a DC power source (e.g., a battery power source). DC power sources typically discharge at a rate proportional to the amount of current being drawn. Thus, if the current demands on the DC power source are relatively high, the DC power source can discharge at a faster rate than if the current demands are relatively low. The peak power limiting scheme can minimize peak current demands by preventing, for example, two components from being simultaneously active in order to perform a similar task. Beginning at step 1110, an instruction can be received to execute a power consuming event (e.g., an alarm notification event). Then, at step 1120, a determination is made as to whether the power consuming event is able to be independently executed by each one of at least two power consuming components of a plurality of power consuming components. For example, the power consuming components can include at least one processor, at least one hazard sensor, a speaker, an alarm, low-power wireless communications circuitry, and high-power wireless communications circuitry.

At step 1130, when the power consuming event has been determined to be independently executed by each one of the at least two power consuming components of the plurality of power consuming components, execution of the power consuming event is limited to one of the at least two power consuming components. For example, if the power consuming event is an alarm notification event, and the at least two power consuming components include a speaker and an alarm, the peak power limiting scheme can prevent the speaker from operating during the alarm notification event. As another example, if the power consuming event is an alarm notification event, and the at least two power consuming components include low-power wireless communications circuitry and high-power wireless communications circuitry, the peak power limiting scheme can prevent both the low-power wireless communications circuitry and the high-power wireless communications circuitry from simultaneously communicating respective alarm notifications. The peak power limiting scheme may permit the low-power wireless communications circuitry to communicate its alarm (so that other systems that have the low-power wireless communications circuitry can be alerted to the alarm) before allowing the high-power wireless communications circuitry to communicate its alarm. Once the low-power circuitry has completed its alarm transmission, it is turned off, and the high-power circuitry is activated so it can transmit its alarm notification. Both wireless communications circuitry can cycle ON and OFF in a repeated fashion, but they are both not simultaneously active. This prevents both communications circuitry from simultaneously drawing current from the power source.

Figure 12:
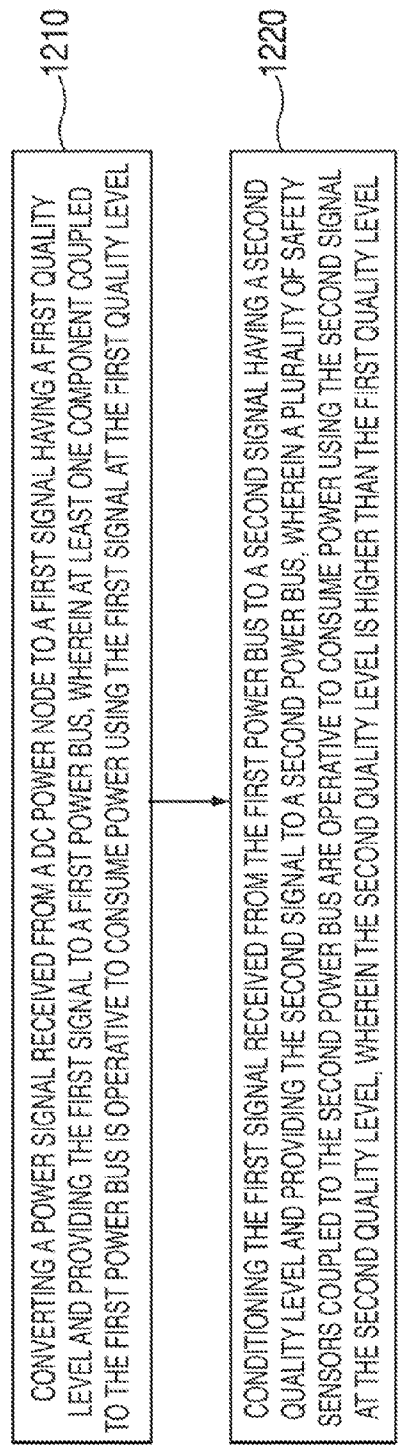
FIG. 12 shows an illustrative flowchart of steps that may be taken to provide power of varying quality to components within a hazard detection system, according to some embodiments.

FIG. 12 shows an illustrative flowchart of steps that may be taken to provide power of varying quality to components within a hazard detection system. As discussed above in connection with FIG. 3, certain components (e.g., safety sensors) may have more stringent power requirements than other components (e.g., wireless communications circuitry). Beginning with step 1210, a power signal received from a DC power node is converted to a first signal having a first quality level and that first signal is provided to a first power bus. The power signal can be provided, for example, by a battery power source, an AC-to-DC converter, which receives line power, or a ported DC source such as a USB power source. Power converting circuitry such as, for example, power converting circuitry 342 of FIG. 3 can convert the power signal received on power bus 308. At least one component is coupled to the first power bus and is operative to consume power using the first signal at the first quality level. For example, components such as FEM 315, ultrasonic sensor 320, ALS 322, and temperature and humidity sensor 323 (of FIG. 3) can receive power from the first power bus (e.g., power bus 343).

At step 1220, the first signal received from the first power bus is conditioned to a second signal having a second quality level and the second signal is provided to a second power bus. The second quality level is higher than the first quality level. For example, a low-dropout regulator (e.g., LDO 348 of FIG. 3) can condition the signal. The low-dropout regulator can maintain the second signal at the second quality level regardless of the first quality level of the first signal being conditioned. In some embodiments, the first quality level includes a relatively large voltage swing when the at least one component initially draws power from the first power bus, but the conditioning ensures that the second quality level does not include the relatively large voltage swing, but rather, a relatively negligible voltage swing when the at least one component initially draws power from the first power bus. Several safety sensors can be coupled to the second power bus that are operative to consume power using the second signal at the second quality level. For example, safety sensors such as a smoke detector and a carbon monoxide detector may require higher quality power in order to accurately function.

Figure 13:
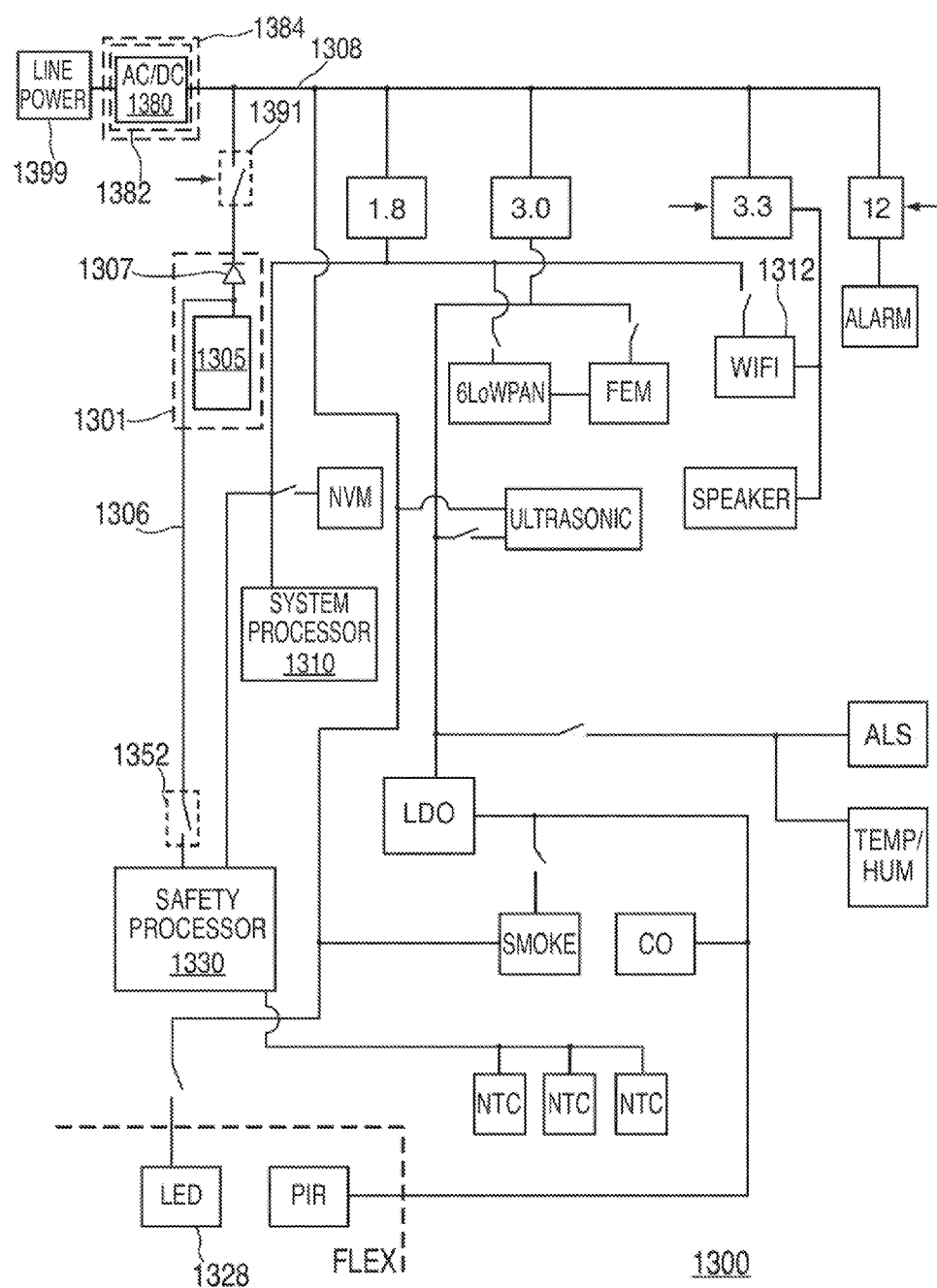
FIG. 13 shows an illustrative circuit schematic of a line powered hazard detection system, according to some embodiments.

FIG. 13 shows an illustrative circuit schematic of line powered hazard detection system 1300 in accordance with an embodiment. System 1300 can share many of the same components as battery powered hazard detection system 300 of FIG. 3. In fact, similar components share the same least significant digits in reference numbers. For example, the two least significant digits of system processor 1330 are the same as the least two significant digits as system processor 330. Differences between system 1300 and system 300 include the addition of AC-to-DC converter 1380, protective case 1382, printed circuit board 1384, and switch 1391, and the elimination of one or more battery cells, or more particularly, one of the battery cell groups. In some embodiments, the addition of AC-to-DC converter 1380, protective case 1382, and printed circuit board 1384 can occupy space within the housing that would otherwise be occupied by the missing battery cell group.

AC-to-DC converter 1380 is operative to convert line power received from line power source 1399 to a DC signal that is provided to power bus 1308. This DC signal may be used as the DC power source for all downstream components of system 1300. The DC signal can have a predetermined DC voltage (e.g., 5 volts). Converter 1380 may be coupled to wires, which are coupled to leads connected to line power source 1399. For example, system 1300 may have pigtail connectors or terminal connectors (not shown) for making a wired connection to line power source 1399. Converter 1380 can be any suitable type of converter capable of converting an AC signal to a DC signal. Converter 1380 can have its own controller (not shown) or it can be controlled by another processor resident in system 1300 (e.g., processor 1310 or processor 1330). In one embodiment, converter 1380 can be a flyback converter. In some embodiments, converter 1380 may include a transformer so that the DC signal provided by the converter is electrically isolated from line power source 1399. Moreover, electrically isolating the DC signal from line power source 1399 can protect the downstream components of system 1300 in the event of a lightning strike or other abnormal condition on line power source 1399.

Line power source 1399 can provide AC signals at relatively high voltage (e.g., 120 volts or 240 volts). Because the AC line voltage is relatively high, converter 1380 can be enshrouded within protective case 1382 to provide protection against potential hazards (e.g., electrocution, electric shock, electrical fire, etc.). Protective case 1382 can constructed from a plastic or other dielectric material. Additional protection and electrical isolation can be achieved by incorporating converter 1382 and protective case 1382 on printed circuit board 1384. Printed circuit board 1384 can be separate from the board the other components are mounted to. In some embodiments, the combination of AC-to-DC converter 1380, protective case 1382, and printed circuit board 1384 can form a module that may be removably coupled to a connector within system 1300. If desired, the module could be removed and replaced with a battery module, in which case, system 1300 would closely mimic system 300.

When line power is available, AC-to-DC converter 1380 provides DC power to power bus 1308 and line power source 1399 can serve as the power source for system 1300. When line power goes down or the voltage on power bus 1308 drops below a predetermined threshold, battery system 1301 can supply power to power bus 1301, in which case, battery system 1301 serves as the power source of system 1300. Battery system 1301 can provide DC power to power bus 1308 when switch 1391 is CLOSED. Switch 1391 can be controlled by a number of different approaches. In one embodiment, switch 1391 can be controlled by voltage detection circuitry (not shown) that monitors the voltage on power bus 1308. If the voltage on power bus drops below a first predetermined voltage, the voltage detection circuitry can instruct switch 1391 to CLOSE. If the voltage on power bus 1308 exceeds a second predetermined voltage (which may be higher than the first predetermined voltage), switch 1391 can be instructed to OPEN, thereby removing battery system 1301 from power bus 1308. When the voltage on power bus 1308 exceeds the second predetermined voltage, this is indicative that AC-to-DC converter 1380 is operating and line power is available.

Battery power system 1301 can include battery cell group 1305. Battery cell group 1305 can include one or more battery cells. In one embodiment (as shown), these battery cells are not rechargeable. In another embodiment, the battery cells can be rechargeable. In the rechargeable embodiment, additional circuitry (not shown) would be needed to charge the batteries when line power is available. As shown, battery cell group 1305 is coupled to diode 1307 and to sensor processor 1330 via bus 1306 and gating circuitry 1352. Safety processor 1330 can temporarily close gating circuitry 1352 to measure the voltage of battery group 1305. After the measurement is complete, safety processor 1330 can open gating circuitry 1352. Diode 1307 is coupled to power bus 1308 via switch 1391.

Line powered hazard detection system 1300 can operate according to different constraints than its battery only counterpart. The line power source provides virtually unlimited power to enable system 1300 to employ many features without any run-time constraints. In some embodiments, system 1300 can implement more features than a battery powered system (e.g., system 300). Even if system 1300 were to function with the same features as its battery powered counterpart, it can operate any one of those features continuously. For example, WiFi module 1312 can provide log updates in real-time as opposed to periodically.

Figure 14:
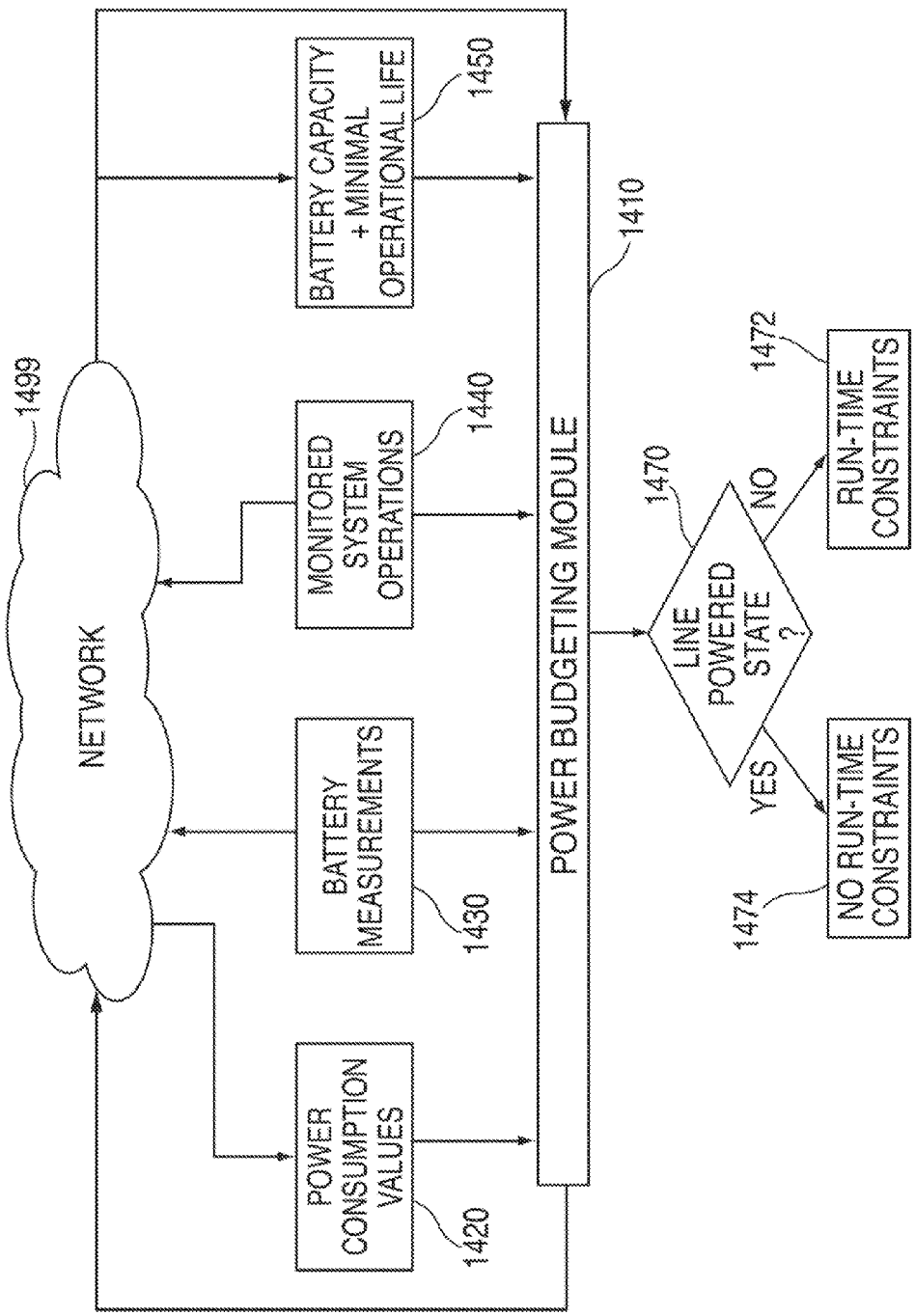
FIG. 14 shows an illustrative block diagram of a power budgeting scheme, according to some embodiments.

FIG. 14 shows an illustrative block diagram of a power budgeting scheme for a line powered hazard detection system according to an embodiment. FIG. 14 is similar in many respects to FIGS. 7 and 8, except that a decision whether to enforce run-time constraints is based on whether the line powered hazard detection system is in a line powered state. If the hazard detection system is receiving power from an external power source such as line power or an external DC power source (e.g., USB power), the system is operating in a line powered state. If the hazard detection system is not receiving power from an external power source, but from an internal power source, the system is operating in a non-line powered state. If the system is in a line powered state (1470), then no run-time constraints 1474 may be imposed on the system. No constraints need to be imposed on the system because there is "virtually" unlimited power available to power the system.

If the hazard detection system is not in a line powered state (1470), then run-time constraints 1472 can be imposed on the system. The run-time constraints can be calculated based on any one of the following factors: power consumption values 1420, battery measurements 1430, monitored system operations 1440, and battery capacity and operational life 1450. In addition, run-time constraints can be pushed down to power budgeting module 1410 by network 1499. In one embodiment, the run-time constraints can be applied in a manner similar to how run-time constraints are used in a battery-only system (such as that described above in connection with FIGS. 3-8). In another embodiment, the run-time constraints can be applied in a manner that enables the system to operate similar to how it does when in its line powered state, but for a relatively short period of time (e.g., two weeks). If desired, the run-time constraints can be changed dynamically to ensure that the safety features of the system operate for a minimum period of time.

Figure 15:
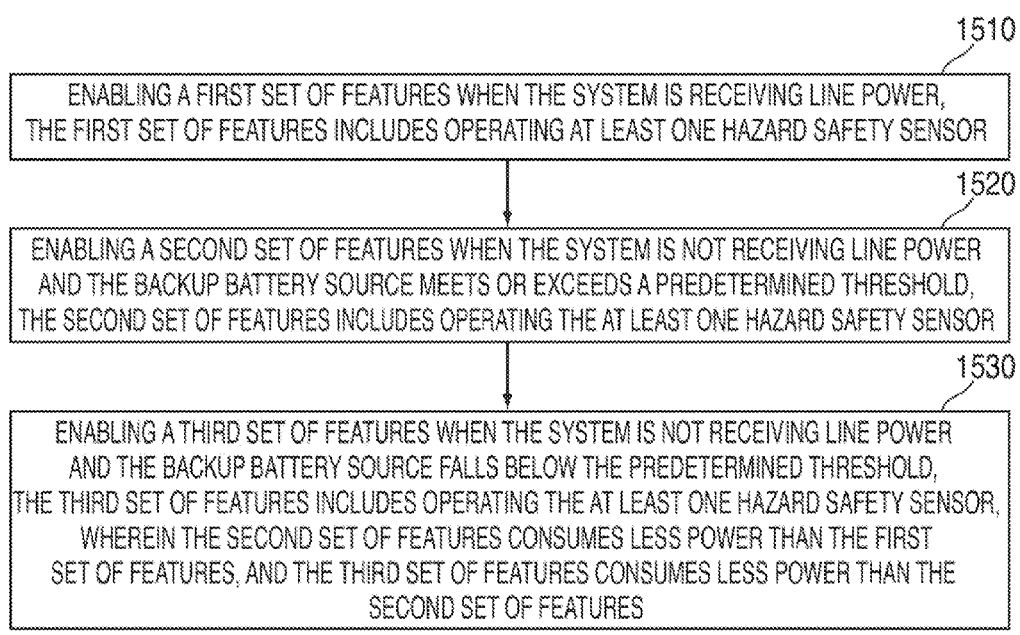
FIG. 15 shows an illustrative flowchart of steps that may be performed by a line powered hazard detection system, according to some embodiments.

FIG. 15 shows an illustrative flowchart of steps that may be performed by a line powered hazard detection system in accordance with an embodiment. The system in which steps of this flowchart can be implemented in, for example, system 1300 of FIG. 13. Beginning with step 1510 a first set of features can be enabled when the system is receiving line power. The first set of features can be a relatively all inclusive feature set. It can include every possible mode of operation of the system (e.g., idle mode, a log update mode, software update mode, display mode, an alarm mode, and other modes). In addition, there may be no limitations on how long or how often any given mode may be executed. For example, wireless communications circuitry (e.g., WiFi module 1312) may always be active so that it can transmit and receive data in real-time. The first set of features can include operating one or more safety sensors (e.g., smoke detector and carbon monoxide sensor).

At step 1520, a second set of features can be enabled when the system is not receiving line power and the backup battery source meets or exceeds a predetermined threshold. The second set of features can be a relatively constrained feature set. It can include all or a subset of the same modes of operations as the first feature set. There may, however, be a limitation on how long and how often any given mode can be executed. In one embodiment, the system may operate without any run-time constrains, but only for a fixed period of time or until the battery power source falls below the predetermined threshold. In another embodiment, the system may operate with run-time constraints for a different fixed period of time or until the battery power source falls below the predetermined threshold. For example, the wireless communications circuitry (e.g., WiFi module 1312) can operate on a periodic basis for fixed period of time. The second set of features can include operating the same one or more hazard safety sensors that are included in the first feature set.

The second feature set can include notification alerts that inform, for example, a user or a remote server that line power is no longer available and that the system is operating on battery power. The alert can be provided in the form of continuous or intermittent wireless communication. In another embodiment, the alert can be provided in the form of a voice announcement or as a display. In one particular embodiment, the display (e.g., LED module 1328) may be instructed display white light as safety lighting.

In yet another embodiment, the second feature set can define a plurality of different modes of operation, each mode of operation configures the system to consume different amounts of power from the backup battery power source, set a first time period, enforce a power budgeting scheme so that the backup battery power source can power the system for the first time period, wherein the power budgeting scheme assigns a duty cycle to each mode of operation such that each mode of operation is budgeted an operational percentage of the first time period. The system can operate according to the duty cycle assigned to each mode of operation. The first time period can be an initial value that may change depending on the status of the backup battery system. For example, the first time period may initially be for three weeks, but if the energy level backup battery source is discharging and cannot last, the power budgeting scheme may re-assign new duty cycle values to one or more of the modes.

Then, at step 1530, a third set of features can be enabled when the system is not receiving line power and the backup battery source falls below the predetermined threshold. This step may be referred to as a low battery state. The third set of features can be a highly constrained feature set. It can include a subset of the same modes of operations as the first feature set or the second feature set. In addition, there may limitations on how long and how often any given mode can be executed. In one embodiment, the system may prevent the system from operating certain modes. For example, in the third feature set, no wireless communications may be permitted. The third features set ensures that one or more of the same hazard safety sensors as in the first and second feature sets are operative. The second set of features can consume less power than the first set of features, and the third set of features can consume less power than the second set of features.

In one embodiment, the third set of features can set a second time period, and the power budgeting scheme re-assigns a duty cycle to each mode of operation such that each mode of operation is budgeted an operational percent-age of the second time period. The system can operate according to the re-assigned duty cycle for each mode of operation.

It is to be understood that the steps shown in the flow-charts of one or more of FIGS. 9-12, 14, and 15 are merely illustrative and that existing steps may be modified or omitted, additional steps may be added, and the order of certain steps may be altered.

It is understood that although the embodiments described herein with respect to a hazard detection system, these embodiments may also be used in any system or device where it is desired to maintain sensing and monitoring of other events while updating the operational capabilities of one or more components of that system or device. For example, the other events can include events that are not necessarily tied to hazards such as smoke, CO, and heat, but can include motion detection, sound detection, and the like. Events reported by remote devices may also be taken into account. For example, security device such as window and door sensor, and motion detection sensors that provide feedback to a system may quality as other events.

Moreover, the processes described with respect to FIGS. 1-15, as well as any other aspects of the invention, may each be implemented by software, but may also be implemented in hardware, firmware, or any combination of software, hardware, and firmware. They each may also be embodied as machine- or computer-readable code recorded on a machine- or computer-readable medium. The computer-readable medium may be any data storage device that can store data or instructions which can thereafter be read by a computer system. Examples of the computer-readable medium may include, but are not limited to, read-only memory, random-access memory, flash memory, CD-ROMs, DVDs, magnetic tape, and optical data storage devices. The computer-readable medium can also be dis-tributed over network-coupled computer systems so that the computer readable code is stored and executed in a distrib-uted fashion. For example, the computer-readable medium may be communicated from one electronic subsystem or device to another electronic subsystem or device using any suitable communications protocol. The computer-readable medium may embody computer-readable code, instructions, data structures, program modules, or other data in a modu-lated data signal, such as a carrier wave or other transport mechanism, and may include any information delivery media. A modulated data signal may be a signal that has one or more of its characteristics set or changed in such a manner as to encode information in the signal.

It is to be understood that any or each module discussed herein may be provided as a software construct, firmware construct, one or more hardware components, or a combi-nation thereof. For example, any one or more of the modules may be described in the general context of computer-executable instructions, such as program modules, that may be executed by one or more computers or other devices. Generally, a program module may include one or more routines, programs, objects, components, and/or data struc-tures that may perform one or more particular tasks or that may implement one or more particular abstract data types. It is also to be understood that the number, configuration, functionality, and interconnection of the modules or state machines are merely illustrative, and that the number, con-figuration, functionality, and interconnection of existing modules may be modified or omitted, additional modules may be added, and the interconnection of certain modules may be altered.

Whereas many alterations and modifications of the pres-ent invention will no doubt become apparent to a person of ordinary skill in the art after having read the foregoing description, it is to be understood that the particular embodi-ments shown and described by way of illustration are in no way intended to be considered limiting. Therefore, reference to the details of the preferred embodiments is not intended to limit their scope.

What is claimed is:

1. A smoke, heat, and carbon monoxide detection system, comprising:
  a DC power node;
  a power converter coupled to the DC power node and operative to provide a first signal at a first voltage level to a power bus;
  at least one component coupled to the power bus and operative to consume power using the first signal at the first voltage level;
  a low dropout regulator coupled to the power bus and operative to convert the first signal to a second signal at a second voltage level; and
  a plurality of safety sensors coupled to the low dropout regulator and operative to consume power at the second voltage level, wherein the first voltage level is different than the second voltage level.

2. The system of claim 1, wherein the power converter is a first power converter and the power bus is a first power bus, the system further comprising:
  a second power converter coupled to the DC power node and operative to provide a second signal at a third voltage level to a second power bus.

3. The system of claim 2, further comprising:
  a wireless communications module coupled to the second power bus and operative to consume power using the second signal at the third voltage level, wherein the third voltage level is higher than the first voltage level.

4. The system of claim 1, wherein the plurality of safety sensors comprises a smoke detector and a carbon monoxide detector.

5. The system of claim 1, wherein the at least one component is a temperature sensor.

6. The system of claim 1, wherein the low dropout regulator is operative to maintain the second voltage level regardless of voltage fluctuations on the power bus.

7. The system of claim 1, further comprising:
  a third power converter coupled to the DC power node and operative to provide a third signal at a fourth voltage level to a third power bus, wherein the fourth voltage level is higher than a voltage level provided at the DC power node and is higher than the first and third voltage levels.

8. The system of claim 1, further comprising a battery power source that is coupled to the DC power node.

9. The system of claim 1, further comprising a AC-to-DC converter that is coupled to the DC power node.

10. A smoke, heat, and carbon monoxide detection system, comprising:
- a DC power node;
- a wireless communications module that requires power having a first set of characteristics;
- a plurality of hazard detectors that require power having a second set of characteristics, the plurality of hazard detectors comprising a smoke sensor and a carbon monoxide sensor;
- first power conversion circuitry coupled to the DC power node and operative to provide power having the first set of characteristics to the wireless communications module; and
- second power conversion circuitry coupled to the first power conversion circuitry and operative to provide power having the second set of characteristics to the plurality of hazard detectors, wherein the second set of characteristics includes a voltage ripple characteristic that is less than a voltage ripple characteristic of the first set of characteristics.

11. The system of claim 10, wherein the second power conversion circuitry is operative to provide power having the second set of characteristics regardless of disturbances in the power provided by the first power conversion circuitry.

12. The system of claim 10, wherein the first power conversation circuitry is a buck converter and the second power conversion circuitry is a low-dropout regulator.

13. The system of claim 10, wherein the second power conversion circuitry is a low-dropout regulator.

14. The system of claim 10, further comprising a temperature sensor that requires power having the first set of characteristics.

15. The system of claim 10, further comprising a passive infrared sensor that requires power having the second set of characteristics.

16. A hazard detection system, comprising:
- a DC power source;
- a power converter coupled to the DC power source;
- a first power bus coupled to the DC power source;
- a second power bus coupled to the power converter;
- a smoke sensor comprising an optical sensor that is operable to be power gated ON and OFF and an optical source that is coupled to the first power bus and operable to be signal driven ON and OFF;
- power gating circuitry that selectively couples and de-couples the optical sensor to the second power bus; and
- control circuitry operative to:
  - selectively power gate the optical sensor ON and OFF by controlling the power gating circuitry; and
  - selectively signal the optical source ON and OFF.

* * * * *